United States Patent
Saiki

(10) Patent No.: US 10,361,386 B2
(45) Date of Patent: Jul. 23, 2019

(54) PLANAR LIGHT EMITTING DEVICE

(71) Applicant: KANEKA CORPORATION, Osaka-shi, Osaka (JP)

(72) Inventor: Hidemaro Saiki, Kamikita-gun (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 15/578,153

(22) PCT Filed: Jul. 20, 2016

(86) PCT No.: PCT/JP2016/071318
§ 371 (c)(1),
(2) Date: Nov. 29, 2017

(87) PCT Pub. No.: WO2017/033630
PCT Pub. Date: Mar. 2, 2017

(65) Prior Publication Data
US 2018/0151820 A1   May 31, 2018

(30) Foreign Application Priority Data
Aug. 26, 2015   (JP) ................. 2015-167199

(51) Int. Cl.
*H01L 51/50*   (2006.01)
*F21V 23/00*   (2015.01)
(Continued)

(52) U.S. Cl.
CPC .......... *H01L 51/5012* (2013.01); *F21K 9/238* (2016.08); *F21K 9/278* (2016.08);
(Continued)

(58) Field of Classification Search
CPC ............. H01L 51/5012; H01L 51/5008; H01L 51/5203; F21K 9/278; F21K 9/238
See application file for complete search history.

(56) References Cited

U.S. PATENT DOCUMENTS

| 8,836,204 B2 * | 9/2014 | Kagotani | .......... B32B 17/10036 |
| | | | 313/45 |
| 2010/0213833 A1 * | 8/2010 | Kawachi | ............. H01L 51/5203 |
| | | | 313/504 |

(Continued)

FOREIGN PATENT DOCUMENTS

| JP | 2007299740 A | 11/2007 |
| JP | 2012104316 A | 5/2012 |

(Continued)

OTHER PUBLICATIONS

ISA Japan Patent Office, Written Opinion Issued in PCT Application No. PCT/JP2016/071318, dated Oct. 25, 2016, WIPO, 5 pages.

(Continued)

*Primary Examiner* — Christine A Enad
(74) *Attorney, Agent, or Firm* — Alleman Hall Creasman & Tuttle LLP

(57) ABSTRACT

Provided is a planar light emitting device which is highly productive employing inexpensive FPCs capable of being easily electrically connected, and which has a light emitting region with reduced unevenness in luminance and hence is highly reliable. The planar light emitting device, which has a light emitting surface and a back surface, includes a planar light emitting tile including a planar light emitting element and a plurality of flexible printed circuits (FPCs) disposed on the back surface. The planar light emitting tile includes a non-pad region where none of an anode pad and a cathode pad are disposed. In an overlapped region where part of two circuit boards overlap each other, an electrical connection site where an equipotential region of the two circuit boards are directly electrically connected to each other is formed. The non-pad region forms a connecting-part disposed region that overlaps with the electrical connection site.

8 Claims, 19 Drawing Sheets

(51) Int. Cl.
    *F21K 9/278*     (2016.01)
    *F21K 9/238*     (2016.01)
    *F21S 2/00*     (2016.01)
    *H05B 33/06*     (2006.01)
    *H01L 51/52*     (2006.01)
    *H05K 1/02*     (2006.01)
    *H05K 1/18*     (2006.01)
    *H05K 1/14*     (2006.01)

(52) U.S. Cl.
    CPC ............... *F21S 2/00* (2013.01); *F21V 23/00* (2013.01); *H01L 51/5008* (2013.01); *H01L 51/5203* (2013.01); *H05B 33/06* (2013.01); *H05K 1/0263* (2013.01); *H05K 1/141* (2013.01); *H05K 1/189* (2013.01); *H05K 2201/049* (2013.01); *H05K 2201/10106* (2013.01); *H05K 2201/10272* (2013.01)

(56) References Cited

U.S. PATENT DOCUMENTS

2011/0134364 A1     6/2011     Neyama et al.
2013/0093308 A1*     4/2013     Kagotani .......... B32B 17/10036
                                                                          313/45
2015/0247626 A1     9/2015     Kang et al.
2016/0172622 A1*     6/2016     Oh ..................... H01L 51/0097
                                                                          257/40
2017/0276317 A1*     9/2017     Nishikawa .............. F21V 3/061

FOREIGN PATENT DOCUMENTS

| | | |
|---|---|---|
| WO | 2010026811 A1 | 3/2010 |
| WO | 2011136262 A1 | 11/2011 |
| WO | 2014042467 A1 | 3/2014 |
| WO | 2015012610 A1 | 1/2015 |

OTHER PUBLICATIONS

European Patent Office, Supplementary European Search Report Issued in Application No. 16838977, dated Jun. 5, 2018, Netherlands, 2 pages.

ISA Japan Patent Office, International Search Report Issued in PCT Application No. PCT/JP2016/071318, Oct. 25, 2016, WIPO, 4 pages. (Submitted with English Translation of International Search Report).

* cited by examiner

PLANAR LIGHT EMITTING DEVICE

TECHNICAL FIELD

The present invention relates to a planar light emitting device, and particularly to a planar light emitting device that includes a flexible printed circuit (FPC) of a specific structure for supplying power to a planar light emitting element included in the planar light emitting device.

BACKGROUND ART

In recent years, LEDs, cold cathode tubes configured by cold cathode fluorescent tubes, organic ELs, and the like have been gathering attention as novel light sources that would replace incandescent lamps and fluorescent lamps configured by hot cathode fluorescent tubes. In particular, planar light emitting devices, such as organic EL panels, are expected to serve as illumination devices that exhibit an unprecedented effect with the characteristics of the above-described novel light sources fully exploited.

Here, a planar light emitting device has a structure including planar light emitting elements that emit light in a planar manner. For example, such a planar light emitting device may be an LED tile in which LEDs being planar light emitting elements are arranged in a planar manner, or in which LEDs and a diffusion plate are combined with each other. Further, other planar light emitting device may be an organic EL element including wiring for receiving power from an external source, and additionally including a control circuit, a circuit board equipped with the control circuit and the like (PCB), and a housing.

Among planar light emitting elements, an organic EL element is characterized by planar light emission, and additionally by being thin, lightweight, and emitting soft diffused light. In general, such an organic EL element is formed by base members such as a glass substrate, a transparent resin film, and a metal sheet. On an element-formed surface of the substrate, two thin-film electrode layers opposing to each other, one or both of which being light-transmissive, and an organic functional layer interposed between the thin-film electrode layers are formed. Thus, an organic EL element is obtained. Further, in general, in order to prevent entry of moisture or oxygen into the element from the outside, the element is further sealed, thereby manufactured as an organic EL tile including the base member. When power is applied between the electrode layers, the electrically excited electrons and holes recombine with each other in the organic EL element, whereby the organic EL tile emits light.

Further, a planar light emitting device which includes such an organic EL tile provided with wiring for receiving power from an external source is referred to as an organic EL panel. The organic EL panel generally includes an anode pad conducted to an anode thin-film electrode layer so as to be equipotential. Hereupon, the anode thin-film electrode layer is the anode and one of the above-described thin-film electrode layers. Additionally, the organic EL panel includes a cathode pad conducted to a cathode thin-film electrode so as to be equipotential. Hereupon, the cathode thin-film electrode is the cathode and the other one of the above-described thin-film electrode layers. The organic EL panel is formed by soldering leads to these pads (the anode pad and the cathode pad) formed film-like on an element-formed surface, or by mounting an element-dedicated circuit board such as a flexible printed circuit (FPC) or other wiring members to these pads. Note that, the terms used herein such as an organic EL tile and an organic EL panel are defined in International Standards IEC 62868.

In the above-described FPC, in general, at least one continuous equipotential region is formed on one or both of the surfaces of a resin-made insulating film, which is the base member and made of polyimide or the like. This equipotential region is formed by bonding a patterned metal film such as copper foil or aluminum foil, to achieve electrical conduction at low resistance.

A planar light emitting device including such an FPC is disclosed in Patent Document 1. The organic EL illumination device disclosed therein includes, on a glass substrate, an organic EL element and a plurality of anode terminal electrodes and cathode terminal electrodes for evenly supplying current to the organic EL element. The organic EL illumination device includes a circuit board having a circuit provided with anode wiring corresponding to the position of the anode terminal electrodes, and a circuit provided with cathode wiring corresponding to the position of the cathode terminal electrodes.

Further, Patent Document 2 discloses, as such a planar light emitting device, an EL light source body capable of stably supplying power while securing the mechanical strength. The EL light source body is structured by aligning and overlaying (fitting), in sequence, a front surface case disposed on the light-emitting front surface side, an EL element housed in the front surface case and emits light, a circuit board that supplies power to the EL element, and a back surface case. The front surface case includes a planar supporting part that houses the EL element, and a frame. The circuit board includes a terminal part, and a wiring part that supplies power to the EL element through a wiring pattern and connection pattern. The back surface case fits into the front surface case so as to cover the back surface opposite to the front surface from which light is emitted, and includes a covering part and a frame that houses therein the EL element.

PRIOR ART DOCUMENTS

Patent Documents

Patent Document 1: WO 2011/136262 A
Patent Document 2: JP 2007-299740 A

DISCLOSURE OF INVENTION

Technical Problem

In order to make full use of the characteristics of planar light emitting elements that emit light in a planar manner in a planar light emitting device, in general, it is important to equalize the in-plane distribution of luminance or color of emitted light when the light is emitted in a planar manner.

For example, in an LED tile, LEDs arranged in a planar manner or a plurality of LEDs that supply light to a diffusion plate must uniformly emit light. As for an organic EL element, the corresponding light emitting region must emit light evenly.

However, in order to realize such even light emission, the conducting path to the planar light emitting element must be elaborately designed. For example, a light-transmissive anode thin-film electrode layer generally used in an organic EL tile is normally made of a light-transmissive conductive metal oxide which exhibits high resistance. Accordingly, in the case where supply voltage is applied just to one location in the anode thin-film electrode layer, the amount of flowing current varies among several in-plane locations in the layer. Thus, voltage drops at a location where the amount of flowing current is relatively small. This causes unevenness in the in-plane voltage distribution and, consequently, the in-plane luminance distribution in the light emitting region becomes uneven. Such unevenness in the in-plane luminance distribution becomes greater as the light emitting region is larger. A great degree of unevenness impairs appearance and design. In particular, with an organic EL element, a great degree of unevenness also disadvantageously influences life and reliability.

A known means for realizing uniform light emission, for example, for an organic EL tile that includes an organic EL element having a square light emitting region, is to dispose the above-described anode pad near each of the four sides of the anode thin-film electrode layer of the organic EL element, and to dispose the above-described cathode pad near each of the four corners thereof. That is, the means intends to cause four directional current flow from the four anode pads and the four symmetric cathode pads at four-fold rotational symmetric positions toward the center of the thin-film electrode layer. Such means have been conventionally performed, and known to be effective in suppressing occurrence of unevenness in in-plane luminance.

Patent Documents 1 and 2 described an FPC structure of applying voltage from a plurality of anode pads and cathode pads to supply power to a planar light emitting element used in a planar light emitting device, the element having the pads therearound. In more detail, Patent Documents 1 and 2 disclose use of a plurality of FPCs overall structure of which shows a square annular shape corresponding to the arrangement of the pads. That is, both Patent Documents 1 and 2 propose use of a plurality of FPCs instead of use of one FPC that itself shows a square-annular shape which is low in material utilization efficiency and hence is costly. Thus, Patent Documents 1 and 2 propose the FPC that eliminates any wasted insulating sheet material on the inner side of the square-annular shape.

That is, Patent Document 1 discloses the structure of a combination of two L-shaped FPCs that show the shape of a square-annular shape as a whole. Patent Document 2 discloses the structure of a combination of eight pieces of I-shaped FPCs that show the shape of a square-annular shape as a whole.

The structure disclosed in Patent Document 1 uses further additional two connection-purpose L-shaped FPCs for connecting the two L-shaped FPCs to each other. Such an increase in the number of components disadvantageously increases costs. Further, since the connecting part between the organic EL tile and the FPCs becomes a non-light-emitting frame region, the connecting part is preferably as narrow as possible. In terms of the manufacturing cost of the FPCs also, the narrower design is cost-effective. On the other hand, it is difficult to surely connect the narrow FPCs to each other without inviting short-circuiting or disconnection. That is, this structure requires the two L-shaped FPCs and the two connection-purpose L-shaped FPCs to be highly precisely disposed without any misalignment, which is technically difficult and greatly disadvantageously influences the yield and the manufacturing cost.

Further, in the structure disclosed in Patent Document 2, a jumper wire is used for connecting between the I-shaped FPCs corresponding to a square-annular shape divided into eight pieces, and part of the jumper wire overlaps with the FPC in mounting. Accordingly, the thickness of the organic EL panel disadvantageously increases by the thickness of the jumper wire. Further, in the case where the FPCs are designed to be narrow, it poses the challenge of requiring great skill in soldering the jumper wires separately due to anode and cathode on the narrow connecting part.

Accordingly, an object of the present invention is to provide a planar light emitting device which can be electrically connected easier than the conventional technique, and which is inexpensive and highly productive.

Solution to Problems

As a result of a study conducted by the present inventors in view of the problems described above, the present inventors come up with the idea of employing a plurality of power supplying FPCs per panel for supplying power to the anode pads and the cathode pads on the back surface of a planar light emitting tile, and overlaying conductive layers of the adjacent FPCs on each other and establishing electrical connection between the conductive layers. The present inventors have found that such a structure improves the material utilization efficiency of the FPCs and facilitates FPC wiring to the pads on the back surface, and arrived at the present invention.

That is, an aspect of the present invention is a planar light emitting device includes: a planar light emitting tile including: a light emitting surface having a light emitting region; a back surface, both of the light emitting surface and the back surface constituting main surfaces; and a light emitting element on the light emitting surface; and a plurality of circuit boards on the back surface, wherein the planar light emitting element includes: an anode; and a cathode, the planar light emitting element emitting light upon application of voltage between the anode and the cathode, wherein the planar light emitting tile further includes: an anode pad conducted to the anode of the planar light emitting element to be equipotential; a cathode pad conducted to the cathode of the planar light emitting element to be equipotential; a region where the anode pad is disposed; a region where the cathode pad is disposed; and a non-pad region where none of the anode pad and the cathode pad are disposed, wherein each of the plurality of circuit boards is a flexible printed circuit and includes: an anode-dedicated equipotential region; and a cathode-dedicated equipotential region, wherein the plurality of circuit boards include: a first circuit board; a second circuit board adjacent to the first circuit board; and an overlapped region, wherein part of the first circuit board and part of the second circuit board overlap with each other on the back surface, to be the overlapped region where the part of the second circuit board is positioned between the part of the first circuit board and the back surface, wherein the overlapped region includes at least one of an anode-side electrical connection site where the anode-dedicated equipotential region of the first circuit board and the anode-dedicated equipotential region of the second circuit board are electrically connected to each other, and a cathode-side electrical connection site where the cathode-dedicated equipotential region of the first circuit board and the cathode-dedicated equipotential region of the second circuit board are electrically connected to each other, and wherein the non-pad region is a connecting-part disposed region that overlaps with the electrical connection site.

In the planar light emitting device according to the present aspect, preferably, the circuit board having a portion that configures part of the overlapped region each has the portion that configures the part of the overlapped region and another portion, and in the another portion, the anode-dedicated equipotential region is electrically connected to at least one of the anode pads and/or the cathode-dedicated equipotential region is electrically connected to at least one of the cathode pads.

In the planar light emitting device according to the present aspect, preferably, the back surface of the planar light emitting tile as seen in a plan view consists of: a light emitting region corresponding part overlapping with the light emitting region; and a peripheral part, the anode pad and the cathode pad are disposed in the peripheral part, and the peripheral part consists of: a region where the anode pad is disposed; a region where the cathode pad is disposed; and the non-pad region where none of the anode pad and the cathode pad are disposed.

Further preferably, the planar light emitting tile has a quadrangular shape as seen in a plan view, the peripheral part is continuous in a quadrangular annular manner and disposed outside the light emitting region corresponding part; when the back surface is seen in a plan view, the non-pad region is configured at each of portions near four corners of the back surface; and the non-pad regions positioned near to the four corners serve as the connecting-part disposed regions.

In the planar light emitting device according to the present aspect, preferably, the circuit board has a shape that linearly extends as seen in a plan view or a shape that is partially bent and extends, the circuit board having an FPC connecting-pad disposed part, the FPC connecting-pad disposed part constitutes part of the overlapped region and includes at least one of an anode-side conductive part that constitutes part of the anode-side electrical connection site, and a cathode-side conductive part that constitutes part of the cathode-side electrical connection site, and the FPC connecting-pad disposed part is provided at an end side in an extending direction of the circuit board.

Further, in the planar light emitting device according to the present aspect, preferably, each of the plurality of circuit boards has an FPC connecting-pad disposed part; the FPC connecting-pad disposed part constitutes part of the overlapped region, and includes at least one of an anode-side conductive part that constitutes part of the anode-side electrical connection site and a cathode-side conductive part that constitutes part of the cathode-side electrical connection site; the circuit board further includes: a contact surface positioned on the planar light emitting tile side; and a front-side surface opposite to the contact surface; and at least the first circuit board includes at least one of the anode-side conductive part and the cathode-side conductive part in the FPC connecting-pad disposed part on only one of the contact surface and the front-end surface, whereas at least the second circuit board includes at least one of the anode-side conductive part and the cathode-side conductive part in the FPC connecting-pad disposed part on only the other of the contact surface and the front surface.

Still further, in the planar light emitting device according to the present aspect, preferably, the circuit board further includes: a contact surface positioned on the planar light emitting tile side; and a front-side surface opposite to the contact surface, the anode-dedicated equipotential region of at least the first circuit board includes: a contact surface anode region positioned on the contact surface, and a front-side surface anode region positioned on the front surface, the contact surface anode region and the front-side surface anode region being electrically connected to each other to be equipotential, the cathode-dedicated equipotential region of at least the first circuit board includes: a contact surface cathode region positioned on the contact surface; and a front-side surface cathode region positioned on the front-side surface, the contact surface cathode region and the front-side surface cathode region being electrically connected to each other to be equipotential, and part of the contact surface anode region and part of the front-side surface cathode region are at a position overlapping with each other with a space in a member thickness direction of the first circuit board, and/or part of the contact surface cathode region and part of the front-side surface anode region are at a position overlapping with each other with a space in the member thickness direction of the first circuit board.

Still further, in the planar light emitting device according to the present aspect, preferably, each of the circuit boards includes: a body one-side part that linearly extends in a predetermined direction; and a body other-side part that linearly extends in a direction crossing the predetermined direction, the body one-side part and the body other-side part being continuous to each other, the circuit board having a shape of being partially bent and extending as seen in a plan view, an FPC connecting-pad disposed part is provided respectively at an end part of the body one-side part and an end part of the body other-end part in the extending direction, the FPC connecting-pad disposed part constitutes part of the overlapped region, the FPC connecting-pad disposed part including at least one of an anode-side conductive part that forms part of the anode-side electrical connection site and a cathode-side conductive part that forms part of the cathode-side electrical connection site, and one of the FPC connecting-pad disposed parts includes just one of the anode-side conductive part and the cathode-side conductive part whereas the other of the FPC connecting-pad disposed parts includes just the other of the anode-side conductive part and the cathode-side conductive part.

Still further, preferably, the plurality of circuit boards includes: a first L-shaped circuit board as the first circuit board; and a second L-shaped circuit board as the second circuit board, the first L-shaped circuit board and the second L-shaped circuit board each includes: a body one-side part that linearly extends in a predetermined direction; a body other-side part that linearly extends in a direction crossing the predetermined direction; and a curved continuous part positioned between the body one-side part and the body other-side part, the back surface of the planar light emitting tile consists of: a light emitting region corresponding part that overlaps with the light emitting region as seen in a plan view; and a peripheral part, the back surface being quadrangular as seen in a plan view, the peripheral part is continuous in a quadrangular annular manner and disposed outside the light emitting region corresponding part, the non-pad region is provided at each of portions near four corners of the back surface when the back surface is seen in a plan view, the first L-shaped circuit board and the second L-shaped circuit board each have the curved continuous part in contact with the non-pad region, and each of two of the FPC connecting-pad disposed parts of the first L-shaped circuit board is provided on the different non-pad region in contact with the non-pad region while each of two of the FPC connecting-pad disposed parts of the second L-shaped circuit board is provided further thereon.

In other preferable mode according to the above-described aspect, each of the circuit board extends linearly in a predetermined direction, an FPC connecting-pad disposed part is formed at one end part and the other end part thereof in the extending direction respectively, and each of the FPC connecting-pad disposed parts constitutes part of the overlapped region includes both of an anode-side conductive part that provides part of the anode-side electrical connection site and a cathode-side conductive part that provides part of the cathode-side electrical connection site.

Further preferably, the plurality of circuit boards are four I-shaped circuit boards each linearly extending in a predetermined direction, the back surface of the planar light emitting tile consists of: a light emitting region corresponding part that overlaps with the light emitting region as seen in a plan view; and a peripheral part, the back surface being quadrangular as seen in a plan view, the peripheral part is continuous in a quadrangular annular manner and disposed outside the light emitting region corresponding part, the non-pad region is provided at each portions near four corners of the back surface when the back surface is seen in a plan view, and each of two of the I-shaped circuit boards has the FPC connecting-pad disposed parts on both ends in the longitudinal direction, the I-shaped circuit board overlapping with the different non-pad regions in contact with the non-pad regions while the FPC connecting-pad disposed parts of other two of the I-shaped circuit boards are disposed further thereon.

Further, in the planar light emitting device according to the present aspect, preferably, the back surface of the planar light emitting tile consists of: a light emitting region corresponding part that overlaps with the light emitting region as seen in a plan view; and a peripheral part, at least one of the plurality of circuit boards includes a power supplying terminal connectable to an external power supplying member for supplying power to the planar light emitting element, and the power supplying terminal projects from the peripheral part toward the light emitting region corresponding part to overlap with the light emitting region corresponding part.

Still further, in the planar light emitting device according to the present aspect, preferably, the plurality of circuit boards constitutes an integrated annular circuit board continuous in an annular manner, the annular circuit board being mounted on the back surface of the planar light emitting tile.

Still further, preferably, the annular circuit board is continuous in a quadrangular annular manner so as to be square-annular shaped as seen in a plan view, and the annular circuit board is positioned outside a portion overlapping with the planar light emitting element as seen in a plan view.

Another aspect of the present invention is a planar light emitting device including: a planar light emitting tile including: a light emitting surface having a light emitting region; a back surface, both of the light emitting surface and the back surface constituting main surfaces; and a light emitting element on the light emitting surface; and a plurality of circuit boards on the back surface, wherein the planar light emitting element includes: an anode; and a cathode, the planar light emitting element emitting light upon application of voltage between the anode and the cathode, wherein the planar light emitting tile further includes: an anode pad conducted to the anode of the planar light emitting element to be equipotential; and a cathode pad conducted to the cathode of the planar light emitting element to be equipotential, wherein each of the plurality of circuit boards is a flexible printed circuit and includes: an anode-dedicated equipotential region; and a cathode-dedicated equipotential region, wherein in the each of the plurality of circuit boards, the anode-dedicated equipotential region is electrically connected to at least one of the anode pads and/or the cathode-dedicated equipotential region is electrically connected to at least one of the cathode pads, wherein the plurality of circuit boards include: a first circuit board; a second circuit board adjacent to the first circuit board; and an overlapped region, wherein part of the first circuit board and part of the second circuit board overlap with each other on the back surface, to be the overlapped region where the part of the second circuit board is positioned between the part of the first circuit board and the back surface, and wherein the overlapped region includes at least one of an anode-side electrical connection site where the anode-dedicated equipotential region of the first circuit board and the anode-dedicated equipotential region of the second circuit board are electrically connected to each other, and a cathode-side electrical connection site where the cathode-dedicated equipotential region of the first circuit board and the cathode-dedicated equipotential region of the second circuit board are electrically connected to each other.

In other words, a planar light emitting device whose opposite main surfaces are a light emitting surface including a light emitting region and a back surface, the planar light emitting device including a planar light emitting tile including a planar light emitting element corresponding to the light emitting region, and a plurality of flexible printed circuits (FPCs) disposed on the back surface, wherein the planar light emitting element includes an anode and a cathode and emits light upon application of voltage between the anode and the cathode, the plurality of FPCs each include one anode-dedicated equipotential region and one cathode-dedicated equipotential region, the planar light emitting device further includes, on the back surface, a plurality of film-like anode pads being connected to the anode to be equipotential, and a plurality of film-like cathode pads being conducted to the cathode to be equipotential, the anode-dedicated equipotential region of each of the plurality of FPCs is electrically connected to at least one of the anode pads, the cathode-dedicated equipotential region of each of the plurality of FPCs is electrically connected to at least one of the cathode pads, one of and adjacent one of the plurality of FPCs each have, in an overlapped region where the one FPC and the adjacent FPC overlap each other as seen in a plan view, two FPC-FPC electrical connection sites where the anode-dedicated equipotential region of the one FPC is directly electrically connected to the anode-dedicated equipotential region of the adjacent FPC, and the cathode-dedicated equipotential region of the one FPC is directly electrically connected to the cathode-dedicated equipotential region of the adjacent FPC.

That is, preferably, electrical connection between FPC conductive layers is established by the ends of the FPCs that form part of the overlapped site having such FPC-FPC electrical connection sites. The planar light emitting device having such a structure is highly productive employing inexpensive FPCs with which electrical connection is established easily and surely, and additionally is highly reliable with reduced unevenness in luminance in the light emitting region.

Further, preferably, an each-end single electrode connection FPC which is at least one of the plurality of FPCs has, as the anode-dedicated equipotential region and the cathode-dedicated equipotential region, a conductive path that is conducted in one direction as a whole. Further, preferably, the each-end single electrode connection FPC includes, as the two FPC-FPC electrical connection sites, the two FPC connecting pads including one FPC connecting pad provided at an end in the one direction of the conductive path and other FPC connecting pad provided at other end in the one direction of the conductive path, as an anode-dedicated connecting pad being part of the anode-dedicated equipotential region and as a cathode-dedicated connecting pad being part of the cathode-dedicated equipotential region.

This aspect further improves ease and reliability in establishing electrical connection of the FPCs and, therefore, further improves reliability and productivity of the planar light emitting device. That is, it is preferable to use such each-end single electrode connection FPCs, and electrically connect between FPC conductive layers at one end as to one of the anode side and the cathode side. This structure prevents short-circuiting in wiring during assembly. A quadrangular panel is more preferably formed by a combination of two L-shaped FPCs. This structure realizes even light emission within the light emitting region surface, and implements an inexpensive planar light emitting device which is easily manufactured with just the precision of outer shape alignment, without the necessity of performing highly precise jumper wire soldering work.

Further, preferably, a one-end both electrode connection FPC which is at least one of the plurality of FPCs has, as the anode-dedicated equipotential region and the cathode-dedicated equipotential region, a conductive path that is conducted in one direction as a whole. Further, preferably, the one-end both electrode connection FPC includes, a one-end both electrode connection site that includes two FPC connecting pads serving as the two FPC-FPC electrical connection sites. The one-end both electrode connection site is provided at least at one end in the one direction of the conductive path, and includes two FPC connecting pads, as the two FPC connecting pads, including an anode-dedicated FPC connecting pad being part of the anode-dedicated equipotential region and a cathode-dedicated FPC connecting pad being part of the cathode-dedicated equipotential region.

This preferable aspect provides further inexpensive FPCs, and further improves productivity of the planar light emitting device.

Further, preferably, a square-annular shaped FPC made up of at least two of the plurality of FPCs forms a square-annular shape surrounding a piece of the planar light emitting element as seen in a plan view.

This preferable aspect further improves the luminance unevenness reducing effect.

Effect of Invention

The planar light emitting device of the present invention is a productive device employing inexpensive FPCs which can easily and surely be electrically connected. Further, the planar light emitting device of the present invention is a highly reliable device with small unevenness in luminance in its light emitting region. That is, the present invention provides, without requiring highly precise jumper wire soldering work, an inexpensive and easy to manufacture planar light emitting device which can evenly emit light from the in-plane light emitting region.

BRIEF DESCRIPTION OF DRAWINGS

FIGS. 1A to 1C show one embodiment of a planar light emitting device of the present invention, wherein FIG. 1A is a plan view as seen from the back surface side, FIG. 1B is a section view schematically showing a section taken along line A-A in FIG. 1A, and FIG. 1C is a section view schematically showing a section taken along line B-B in FIG. 1A.

FIGS. 6A to 6C show a set of four pieces of FPCs that can be mounted on the planar light emitting tile shown in FIG. 2, and the back surface of the planar light emitting tile shown in FIG. 2, wherein FIG. 6A shows the state before the FPCs are mounted as seen in a plan view and includes partial detail views, FIG. 6B shows the stage after two of the FPCs are mounted as seen in a plan view, and FIG. 6C shows the state after the four FPCs are mounted as seen in a plan view.

BEST MODE FOR CARRYING OUT THE INVENTION

In the following, a description will be given of embodiment about the present invention.

(Planar Light Emitting Device 100)

Figure 1A:
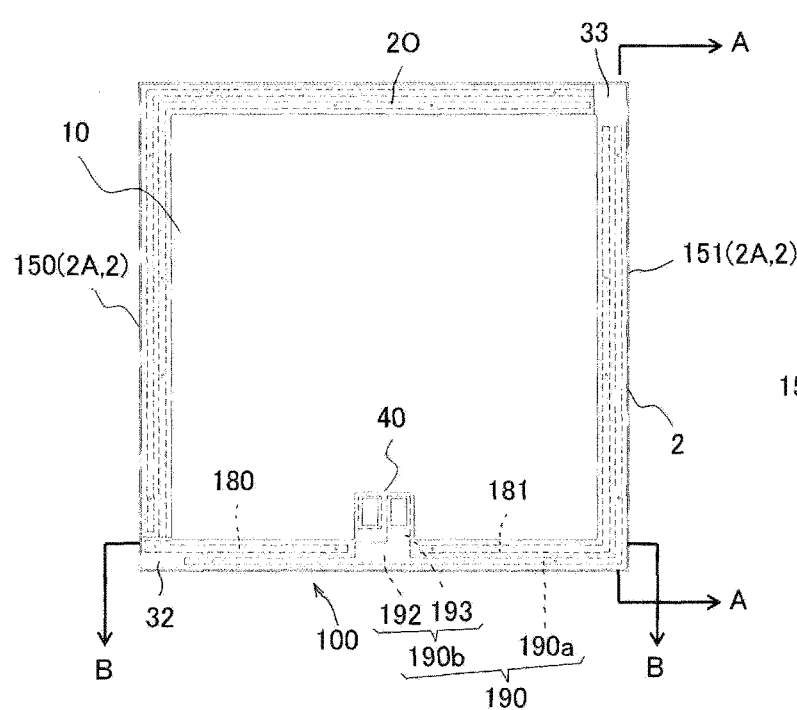
Figure 1B:
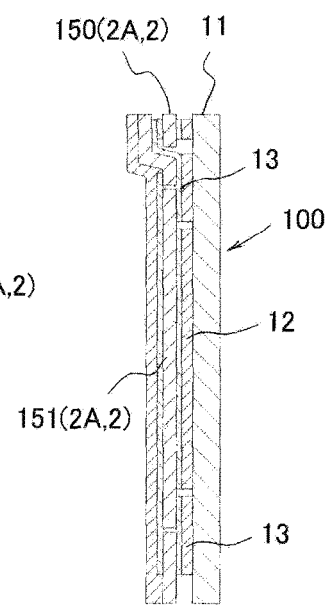
Figure 1C:
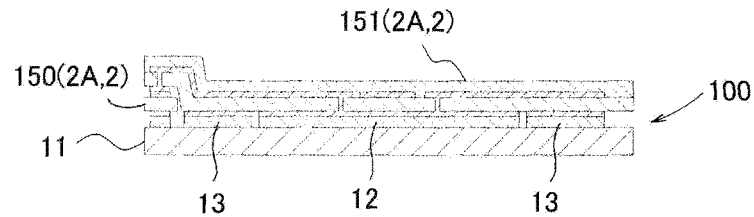

FIGS. 1A to 1C are a diagram showing a planar light emitting device 100 according to one embodiment of the present invention.

As shown in FIG. 1A to 1C, the planar light emitting device 100 according to the present embodiment includes a planar light emitting tile 10, and flexible printed circuits (hereinafter also referred to as FPCs 2 (circuit boards)), more specifically includes a plurality of FPCs 2. The planar light emitting device 100 is preferably an organic EL panel or an LED panel, and more preferably is an organic EL panel.

The planar light emitting tile 10 has two main surfaces which are a light emitting surface including a light emitting region and a back surface. The planar light emitting tile 10 includes a planar light emitting element 1 corresponding to the light emitting region. On the back surface, a plurality of FPCs 2 are disposed.

Figure 2:
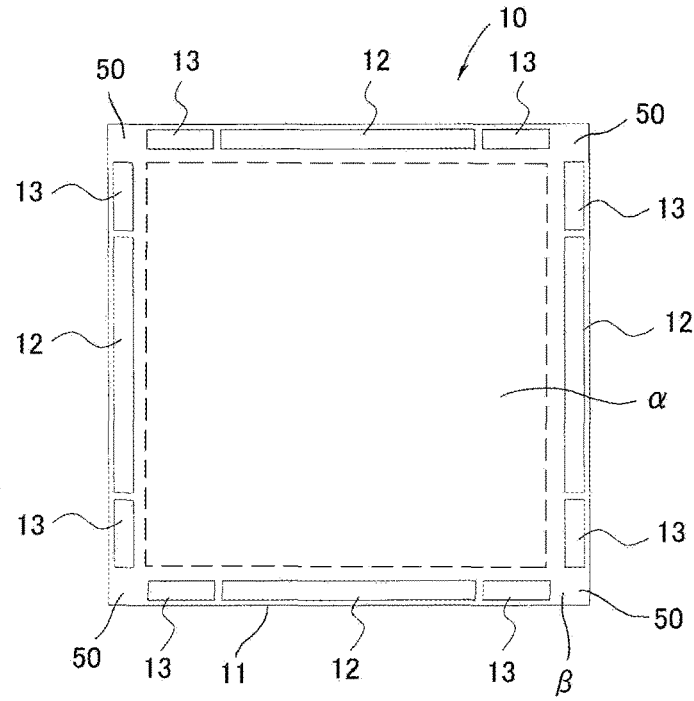
FIG. 2 is a plan view of a planar light emitting tile shown in FIGS. 1A to 1C as seen from the back surface side, showing the pattern of anode pads and cathode pads formed on the planar light emitting tile.

FIG. 2 shows the pattern of anode pads 12 and cathode pads 13 formed on the planar light emitting tile 10 shown in FIG. 1A to 1C, being a plan view of the planar light emitting tile 10 as seen from the back surface side.

The planar light emitting element 1 emits light by application of voltage between the anode and the cathode included in the planar light emitting element 1. Based on this light emission, light is emitted from the light emitting region. In order for the anode and the cathode of the planar light emitting element 1 to be supplied with power from an external source, the planar light emitting tile 10 has, on its back surface, a plurality of film-like anode pads 12 being conducted so as to be equipotential to the anode, and a plurality of film-like cathode pads 13 being conducted so as to be equipotential to the cathode. The anode pads 12 and the cathode pads 13 are supplied with power through the plurality of FPCs 2.

(Planar Light Emitting Tile 10)

The planar light emitting tile 10 according to the present embodiment is preferably one selected from the group consisting of an organic EL tile and an LED tile, and preferably an organic EL tile. In the organic EL tile, on an insulating substrate 11 having two main surfaces of a light emitting surface and an element-formed surface on the back surface thereof, preferably an organic EL element (the planar light emitting element 1) is formed as the planar light emitting element 1. In the LED tile, preferably the planar light emitting element 1 itself is the LED tile (the planar light emitting tile 10).

Here, the shape of the planar light emitting tile 10 as seen in a plan view, that is, the shape of the planar light emitting tile 10 as seen from the back surface side is quadrangular (square).

At nearby locations of each of the four sides of the planar light emitting tile 10, the anode pad 12 and two cathode pads 13 described above are disposed.

Note that, the member thickness direction of the planar light emitting device 100, the member thickness direction of the planar light emitting tile 10, and the member thickness direction of the FPCs 2 which will be described later, are an identical direction. The member thickness direction of the planar light emitting device 100 is identical to the direction in which the planar light emitting tile 10 and the FPCs 2 overlap with each other (the top-bottom direction in FIG. 14).

Here, in the light emitting surface of the planar light emitting tile 10, the position corresponding to the planar light emitting element 1 is the light emitting region. That is, when the planar light emitting element 1 is projected on the light emitting surface of the planar light emitting tile 10, the portion overlapping with the projected plane is the light emitting region. In other words, when the planar light emitting tile 10 is seen in a plan view, the portion overlapping with the planar light emitting element 1 is the light emitting region.

On the other hand, at the back surface of the planar light emitting tile 10, the surface that is opposite to and spaced apart in the member thickness direction from the light emitting region of the light emitting surface is positioned on the central side. As shown in FIG. 2, a light emitting region corresponding part α is the surface positioned at the central side and a peripheral part β is the surface that is continuous in a quadrangular annular manner on the outer side of the light emitting region, thus the part α and the peripheral part β forming the back surface, which is one continuous surface of the planar light emitting tile 10.

That is, the light emitting region corresponding part α is the portion that overlaps with the projected plane when the planar light emitting element 1 is projected on the back surface of the planar light emitting tile 10, and also is a portion that overlaps with the planar light emitting element 1 when the planar light emitting tile 10 is seen in a plan view. The peripheral part β is a region, out of the back surface of the planar light emitting tile 10, that is continuous from the outer edge portion to a portion positioned slightly inward, and is a region that is continuous in an annular manner along the edge portion of the planar light emitting tile 10.

The anode pads 12 and the cathode pads 13 are portions that are conducted to the anode and the cathode of the planar light emitting element 1 respectively so as to be equipotential, and are exposed portions exposed outside on the back surface side of the planar light emitting tile 10. These anode pads 12 and cathode pads 13 are disposed at the peripheral part β.

Here, the anode pads 12 and the cathode pads 13 as seen in a plan view are each in a rectangular shape extending in the longitudinal direction of the nearest side of the planar light emitting tile 10.

In more detail, the length of each anode pad 12 in the longitudinal direction is greater than the length of each cathode pad 13 in the longitudinal direction. Further, the length of each anode pad 12 in the short-side direction (the length in the direction perpendicular to the longitudinal direction of the near side) is identical (or substantially identical) to the length of each cathode pad 13 in the short-side direction.

The distance to the anode pads 1 and the distance to the cathode pads 13 from the nearest side of the planar light emitting tile 10 are identical to each other.

Here, on the back surface of the planar light emitting tile 10, one anode pad 12 and two cathode pads 13 are disposed at positions close to each of the four sides. That is, four anode pads 12 and eight cathode pads 13 in total are disposed on the back surface of the planar light emitting tile 10.

Near the corner where one side of the planar light emitting tile 10 and other side thereof cross each other, a connecting-part-disposed region 50 which is a region where none of the anode pads 12 and the cathode pads 13 are formed (a non-pad region) is formed. In other words, when the planar light emitting tile 10 is seen in a plan view, the connecting-part disposed region 50 is formed near each of the four corners.

Accordingly, near any one side of the planar light emitting tile 10, along the longitudinal direction of this one side and between a location near one end of this one side and a location near the other end of this one side, a first connecting-part disposed region 50, a first cathode pad 13, an anode pad 12, a second cathode pad 13, and other connecting-part disposed region 50 are sequentially juxtaposed to each other.

Based on the foregoing, when the planar light emitting tile 10 is seen in a plan view from the back surface side, from a location near any one corner portion along the edge portion clockwise (or counterclockwise), a connecting-part disposed region 50, a cathode pad 13, an anode pad 12, a cathode pad 13, a connecting-part disposed region 50 . . . , are disposed sequentially. These elements are juxtaposed in a quadrangular annular manner while being spaced apart from each other.

Here, in the circumferential direction along the edge of the planar light emitting tile 10, one connecting-part disposed region 50 is positioned between two cathode pads 13 disposed close to one corner of the planar light emitting tile 10. In other words, in the circumferential direction along the edge of the planar light emitting tile 10, two cathode pads 13 are separated from each other by the connecting-part disposed region 50 so as not to be continuous to each other.

(Organic EL Tile)

In the following, a description will be given about a structure and a method of manufacturing an organic EL tile that is preferable as the planar light emitting tile 10 according to the present embodiment.

The organic EL tile according to the present embodiment is manufactured by sequentially forming, on the insulating substrate 11 (on the element-formed surface), a first electrode film, an organic functional film, and a second electrode film each having a predetermined region, so as to form an organic EL element (the planar light emitting element 1) as a portion where these films overlap with one another. Note that, the insulating substrate 11 preferably is a glass substrate. The organic functional film includes an organic compound as its main component, and further includes a light emitting layer.

The portions in the first electrode film and the second electrode film included in the organic EL element are a first electrode layer and a second electrode layer corresponding to the anode and the cathode, respectively. Preferably, the first electrode layer is set to correspond to the anode, and the second electrode layer is set to correspond to the cathode. More preferably, the first electrode layer is a light-transmissive anode layer, and the second electrode film is a reflective cathode layer. Such an organic EL element is preferably sealed by a sealing film on the element-formed surface, and enclosed between the sealing film and the back surface (the element-formed surface) of the insulating substrate 11. That is, in order to obtain a light emitting device that exhibits long-period durability, the element is preferably sealed by a sealing film for the prevention of water entry.

(Flexible Printed Circuit (FPC 2))

Figure 3:
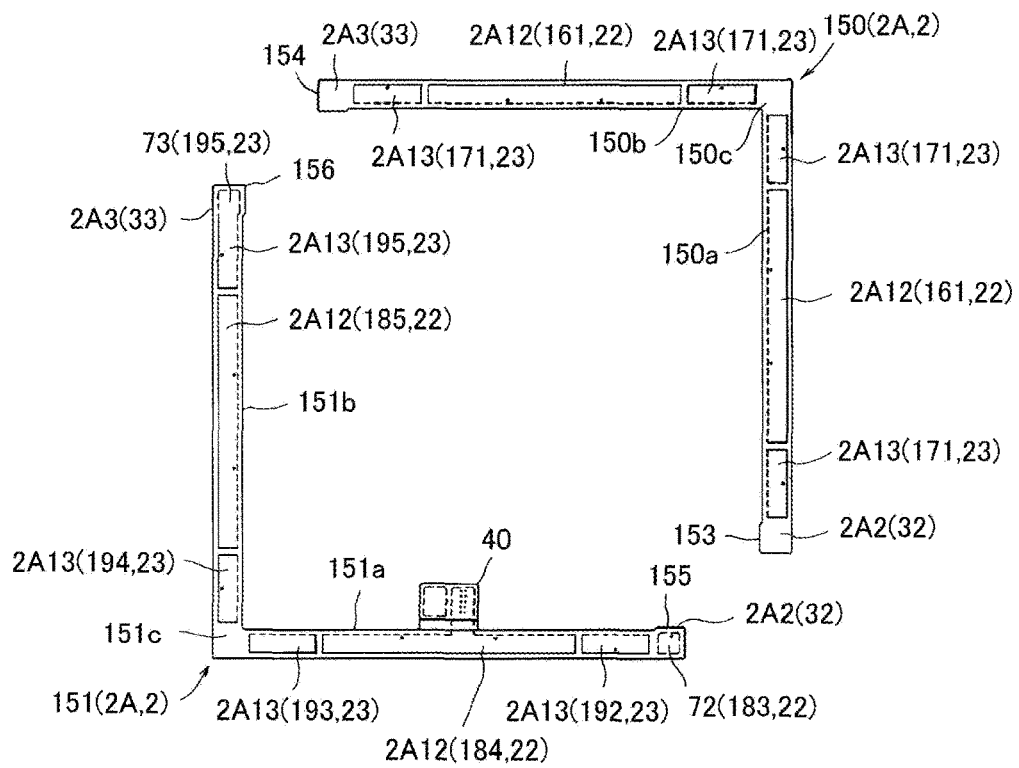
FIG. 3 is a plan view of one embodiment of FPCs according to the present invention, showing a set of two pieces of FPCs as seen from a press-bonded surface side to be in contact with the planar light emitting tile.

FIG. 3 is a plan view of the FPCs 2 (the each-end single electrode connection FPCs 2A) according to the present embodiment as seen from the press-bonded surface to be in contact with the planar light emitting tile 10, and shows a set of two pieces of FPCs 2.

Figure 4:
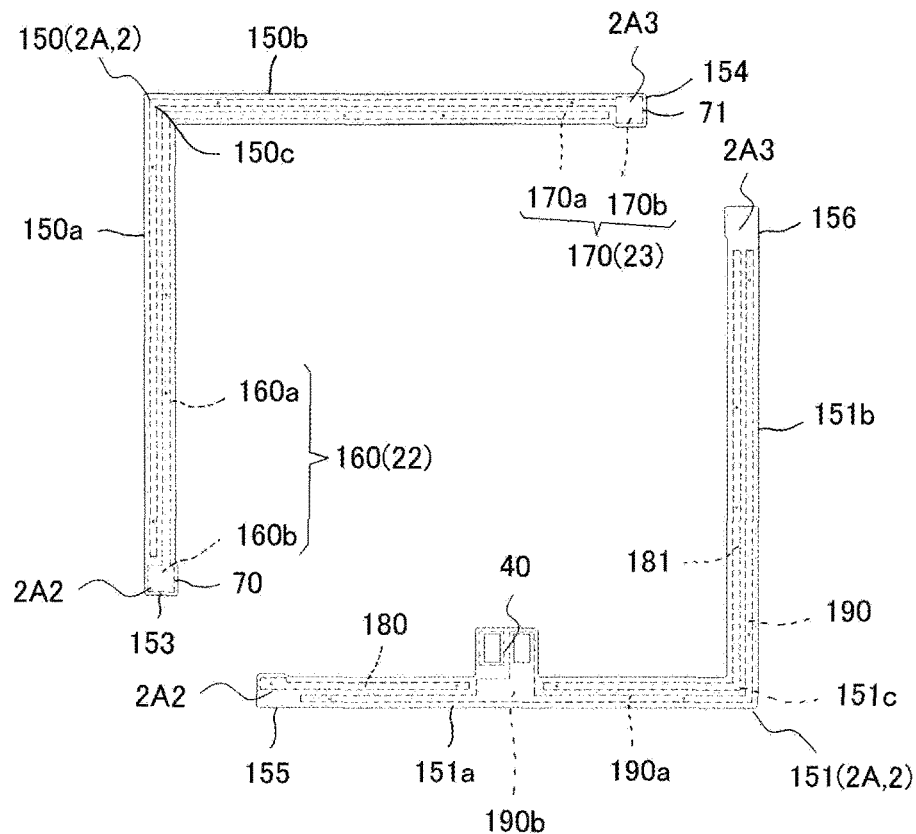
FIG. 4 is a plan view of the set of two pieces of FPCs shown in FIG. 3 as seen from the back surface side.

FIG. 4 is a plan view of the set of two pieces of FPCs 2 shown in FIG. 3 as seen from the back surface side. Note that, the "back surface" in each FPC 2 refers to the surface positioned opposite to the press-bonded surface in the member thickness direction of the FPC 2, and is the surface positioned opposite to and spaced apart from the press-bonded surface. That is, one surface of the film-like or thin-plate like FPC 2 in the member thickness direction is the press-bonded surface, and the other surface is the back surface. It goes without saying that the back surface is also perpendicular to the FPC 2 in the member thickness direction, similarly to the press-bonded surface.

Figure 5:
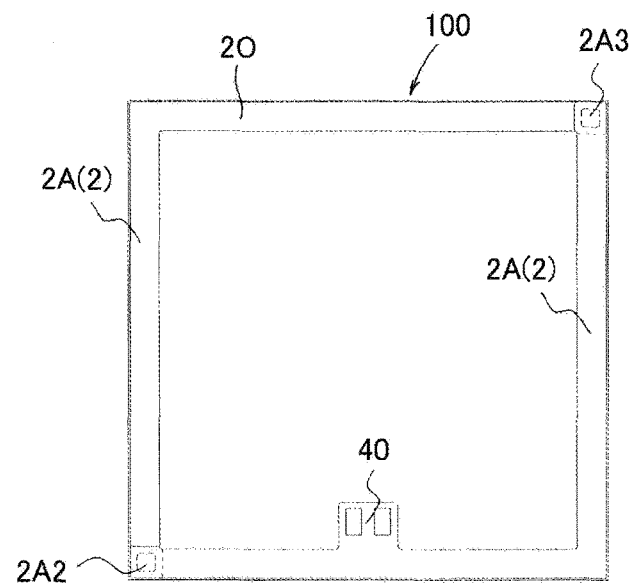
FIG. 5 is a plan view of one embodiment of a planar light emitting device in which the set of two pieces of FPCs shown in FIG. 3 is mounted on the planar light emitting tile shown in FIG. 2, as seen from the back surface side.

FIG. 5 is a plan view of one embodiment of the planar light emitting device 100 as seen from the back surface side, after the set of two pieces of FPCs 2 shown in FIG. 3 is mounted on the planar light emitting tile 10 shown in FIG. 2.

Each of the flexible printed circuits (FPCs 2) includes one anode-dedicated equipotential region 22 and one cathode-dedicated equipotential region 23. The anode-dedicated equipotential region 22 is electrically connected to at least one anode pad 12, and the cathode-dedicated equipotential region 23 is electrically connected to at least one cathode pad 13, and function to relay power supply to the anode and the cathode from an external source described above. Here, power supply from an external source to each FPC 2 is preferably carried out via a power supplying terminal 40 which will be described later and similarly includes an anode-dedicated terminal and a cathode-dedicated terminal which are electrically connected to the equipotential regions (the anode-dedicated equipotential region 22 and the cathode-dedicated equipotential region 23).

As shown in FIG. 5, the power supplying terminal 40 may be provided so as to be directly in contact with the back surface of the planar light emitting tile 10. On the other hand, preferably the power supplying terminal 40 is provided as part of at least one of the plurality of FPCs 2, so as to be an externally drawn out portion while not being in contact with the planar light emitting tile 10. That is, preferably, the FPC 2 is formed by a body part and the power supplying terminal 40 each being thin-plate like, in which the power supplying terminal 40 is a portion externally drawn out from part of the body part. More preferably, by combining two L-shaped FPCs 2, a square-annular shaped FPC 2O (an annular circuit board, which will be described in detail later) having a square-annular shape as seen in a plan view is formed, in which one of the FPCs 2 is provided with the power supplying terminal 40. Here, further preferably, the two L-shaped FPCs 2 are each-end single electrode connection FPCs 2A (which will be described later).

Further, means for connecting the external power supply to the power supplying terminal 40 is preferably a connector. Here, the connector piece on the power supplying terminal 40 side may be mounted on the power supplying terminal 40. Further, it is also possible to implement an FPC connector by bonding, to the FPC 2 having the power supplying terminal 40 disposed at its front surface (one surface in the member thickness direction), as a reinforcing plate at its back surface (other surface in the member thickness direction). This is a preferable mode in view of manufacturing a thin tile (the planar light emitting tile 10).

Each of the FPCs 2 according to the present embodiment has portions for forming two FPC-FPC electrical connection sites 32, 33 (hereinafter simply referred to also as the electrical connection sites 32, 33). That is, one FPC 2 has a portion for forming part of one electrical connection site 32, and a portion for forming part of other electrical connection site 33. The planar light emitting device 100 preferably includes, as such an FPC 2, at least one selected from the group consisting of the each-end single electrode connection FPC 2A which will be described later, and one-end both electrode connection FPC 2B (an I-shaped circuit board) which will be described later.

The electrical connection sites 32, 33 are sites each formed by any one of the FPCs 2 and adjacent other FPC 2 (the adjacent FPC), both being directly electrically connected to each other and being included in the planar light emitting device 100. At the electrical connection sites 32, 33, the anode-dedicated equipotential region 22 of the one FPC 2 is directly electrically connected to the anode-dedicated equipotential region 22 of the other FPC 2, and the cathode-dedicated equipotential region 23 of the one FPC 2 is directly electrically connected to the cathode-dedicated equipotential region 23 of the other FPC 2.

Figure 6A:
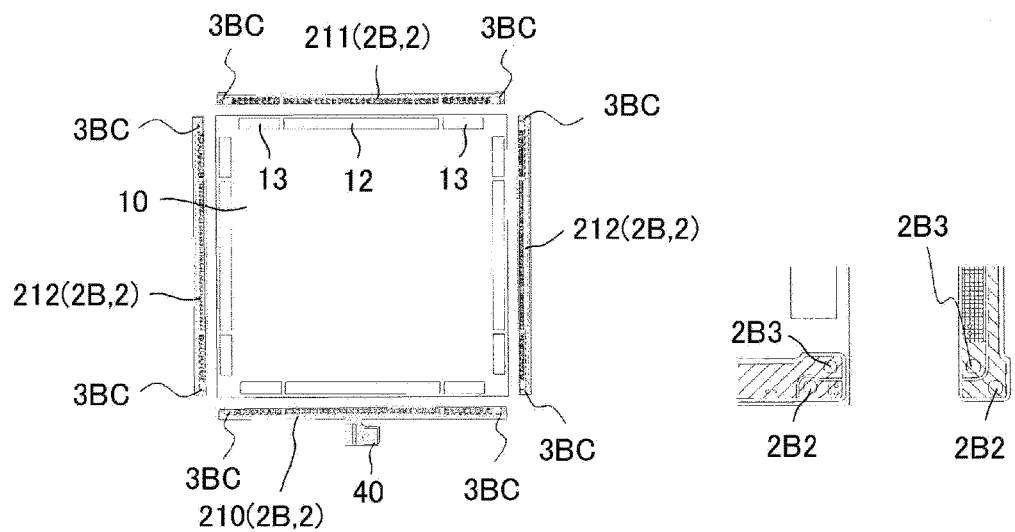
Figure 6B:
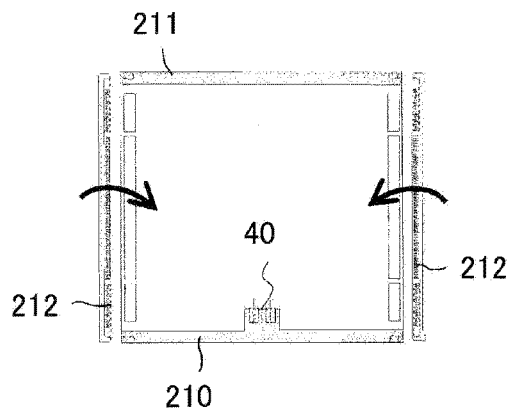
Figure 6C:
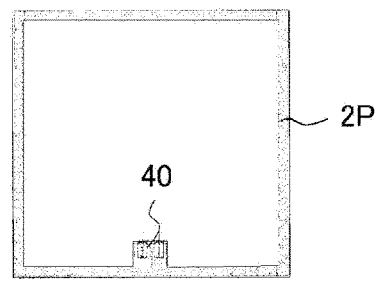

Note that, there are the case where the one-end both electrode connection FPCs 2B shown in FIGS. 6A to 6C are used as the FPCs 2, and the case where the each-end single electrode connection FPCs 2A shown in FIGS. 3, 4, and 5 are used as the FPCs 2. In the case where the one-end both electrode connection FPCs 2B are used, one FPC 2 and adjacent other FPC 2 are identical (or substantially identical) to each other, and a portion that forms part of one of the two electrical connection sites 32, 33 and a portion that forms part of other one of the two electrical connection sites 32, 33 exist at an identical end of one FPC 2 (which will be described in detail later). Further, in the case where the each-end single electrode connection FPCs 2A are used, a portion that forms part of one of the two electrical connection sites 32, 33 and a portion that forms part of other one of the two electrical connection sites 32, 33 discretely exist at opposite ends in one direction in the FPC 2, respectively (which will be described in detail later).

Further, preferably, at least two of the plurality of FPCs 2 forming the square-annular shaped FPC 2O are selected from the group consisting of the each-end single electrode connection FPC 2A (which will be described in detail later) and the one-end both electrode connection FPC 2B (which will be described in detail later). That is, preferably such a plurality of FPCs 2 form a square-annular shape surrounding one planar light emitting element 1 as seen in a plan view.

The method for electrically connecting the FPCs 2 may be at least one method selected from the group consisting of soldering, bonding with a conductive adhesive agent, press-bonding with an ACP (anisotropic conductive paste), press-bonding with an ACF (anisotropic conductive film), and at least one method selected from the group consisting of combinations of at least two of the foregoing methods. More specifically, the at least one method can be applied to the electrical connection of the planar light emitting device 100 solely or in combination.

A well-known type of the conductive adhesive agent is a conductive resin containing particles of Ag or the like. Further, the ACP is a paste-like material in which conductive particles such as gold-plated resin particles are dispersed in an insulating thermosetting resin adhesive agent. By being press-bonded, the ACP becomes conductive in the press-bonding direction. Further, the ACF is a film-like shaped material in which conductive particles such as nickel or gold-plated resin particles are dispersed in an insulating thermosetting resin adhesive agent. By being press-bonded, the ACF becomes conductive in the thickness direction of the film.

(Each-End Single Electrode Connection FPC 2A)

The each-end single electrode connection FPC 2A according to the present embodiment shown in FIGS. 3, 4, and 5 is at least one of the plurality of FPCs 2 of the planar light emitting device 100. The each-end single electrode connection FPCs 2A each have a conductive path that is conducted in one direction as a whole, as the anode-dedicated equipotential region 22 and the cathode-dedicated equipotential region 23, and further includes two FPC connecting pads 2A2, 2A3.

The two FPC connecting pads 2A2, 2A3 serve as two electrical connection sites 32, 33. One FPC connecting pad 2A2 is provided at an end in one direction of the conductive path, and other FPC connecting pad 2A3 is provided at an end in the opposite direction of the conductive path.

Further, two FPC connecting pads 2A2, 2A3 also serve as an anode-dedicated FPC connecting pad 2A2 and a cathode-dedicated FPC connecting pad 2A3, respectively. Further, the anode-dedicated FPC connecting pad 2A2 is also part of the anode-dedicated equipotential region 22, and the cathode-dedicated FPC connecting pad 2A3 is also part of the cathode-dedicated equipotential region 23.

In the following, with reference to FIG. 3, a description will be given about a specific example in which such each-end single electrode connection FPCs 2A are used in supplying power to the planar light emitting tile 10.

FIG. 3 is a plan view of the appearance of a set of two pieces of FPCs 2 that is applicable to the planar light emitting tile 10 shown in FIG. 2. That is, FIG. 3 is a plan view of the press-bonded surface side of the FPCs 2. These two FPCs 2 are each L-shaped as seen in a plan view, and are the each-end single electrode connection FPCs 2A, which form in combination a square-annular shaped FPC 2O.

Further, the two each-end single electrode connection FPCs 2A have anode-dedicated tile connecting pads 2A12 and cathode-dedicated tile connecting pads 2A13, corresponding to the anode pads 12 and the cathode pads 13 of the planar light emitting tile 10 shown in FIG. 2. That is, the anode-dedicated tile connecting pads 2A12 and the cathode-dedicated tile connecting pads 2A13 are provided as part of the anode-dedicated equipotential regions 22 and the cathode-dedicated equipotential regions 23, respectively.

Further, the two each-end single electrode connection FPCs 2A are each provided with two pads, that is, one FPC connecting pad 2A2 for the anode and the other FPC connecting pad 2A3 for the cathode, for connecting between the FPCs 2. That is, four pads in total are provided for the FPCs 2.

In applying these two each-end single electrode connection FPCs 2A to the planar light emitting tile 10 shown in FIG. 2, the FPCs 2 are mounted on the back surface of the planar light emitting tile 10 shown in FIG. 2. These FPCs 2 are two FPCs 2 respectively shown upper right and lower left in FIG. 3, and each have the press-bonded surface shown in FIG. 3. Having the press-bonded surfaces of the FPCs 2 and the back surface of the planar light emitting tile 10 oppose to each other, the FPCs 2 are mounted on the back surface of the planar light emitting tile 10. At this time, the operator mounts the FPCs 2 while seeing the back surfaces (see FIG. 4) of the FPCs 2 which are opposite to the press-bonded surfaces of the FPCs 2. Thus, the back surface of the planar light emitting device 100 shown in FIG. 5 is formed.

That is, in the present specification, respective back surfaces of the FPCs 2, the planar light emitting tile 10, and the planar light emitting device 100 are oriented in an identical direction. Further, the FPC 2 having the press-bonded surface (the contact surface to be in contact with the planar light emitting tile 10) shown upper right in FIG. 3 is the FPC 2 having the back surface (the front surface which is opposite to the contact surface) shown upper left in FIGS. 4 and 5. Similarly, the FPC 2 having the press-bonded surface shown lower left in FIG. 3 is the FPC 2 having the back surface shown lower right in FIGS. 4 and 5.

As shown in FIG. 5, in connection with these two each-end single electrode connection FPCs 2A, after the FPC 2 having the press-bonded surface shown upper right in FIG. 3 is mounted on the planar light emitting tile 10, the FPC 2 having the press-bonded surface shown lower left in FIG. 3 is mounted on the planar light emitting tile 10. At this time, one FPC connecting pad 2A2 of the FPC 2 having the press-bonded surface shown upper right in FIG. 3 is directly electrically connected to one FPC connecting pad 2A2 of the FPC 2 having the press-bonded surface shown lower left in FIG. 3, in the overlapped regions. That is, at the position overlapping with the connecting-part disposed region 50 of the planar light emitting tile 10, two FPC connecting pads 2A2 are electrically connected. Further, other FPC connecting pad 2A3 of the FPC 2 having the press-bonded surface shown upper right in FIG. 3 is directly electrically connected to the other FPC connecting pad 2A3 of the FPC 2 having the press-bonded surface shown lower left in FIG. 3, in the overlapped region. That is, other two FPC connecting pads 2A3 are also electrically connected at the position overlapping with the connecting-part disposed region 50 of the planar light emitting tile 10, the connecting-part disposed region 50 being different from the above-described connecting-part disposed region 50. That is, at the overlapped regions, the FPCs 2 partially overlap with each other. In one of the overlapped portions, anode-side connection is established, and in the other of the overlapped portions, cathode-side connection is established.

In the following, a further specific description will be given about the two each-end single electrode connection FPCs 2A.

The two each-end single electrode connection FPCs 2A that form a pair is a pair of two pieces of FPCs 2, forming one square-annular shaped FPC 2O. The square-annular shaped FPC 2O is structured by one each-end single electrode connection FPC 2A (the FPC 2 shown upper right in FIG. 3, hereinafter referred to also as the first L-shaped FPC 150) and the other each-end single electrode connection FPC 2A (the FPC 2 shown lower left in FIG. 3, hereinafter referred to also as the second L-shaped FPC 151).

As shown in FIG. 3, the first L-shaped FPC 150 (the first L-shaped circuit board) is partially bent and extends so as to be L-shaped as seen in a plan view. One FPC connecting-pad disposed part 153 is positioned at one end in the extending direction, and the other FPC connecting-pad disposed part 154 is positioned at the other end in the extending direction.

As shown in FIG. 4, these FPC connecting-pad disposed parts 153, 154 are respectively provided with an anode-side conductive part 70 and a cathode-side conductive part 71 which will be described later, to serve as portions where the FPC connecting pads 2A2, 2A3 are formed, respectively.

That is, the first L-shaped FPC 150 includes a body one-side part 150*a* that extends linearly including the anode-dedicated FPC connecting-pad disposed part 153 positioned on one end side in the longitudinal direction as seen in a plan view, and a body other-side part 150*b* that extends linearly including the FPC connecting-pad disposed part 154 positioned on one end side in the longitudinal direction. Respective the other ends of these linearly extending portions are continuous to each other at a curved continuous part 150*c*.

In other words, respective the other ends of the body one-side part 150*a* and the body other-side part 150*b* in the longitudinal direction are continuous to each other via the curved continuous part 150*c*. The extending direction of the body one-side part 150*a* and the extending direction of the body other-side part 150*b* are different from each other, and perpendicular to each other.

The lengths in the width direction of the FPC connecting-pad disposed parts 153, 154 are both slightly greater than that of other continuous part.

Note that, the width direction as used herein is the width direction of the first L-shaped FPC 150. That is, the width direction is perpendicular to the member thickness direction of the first L-shaped FPC 150, and also perpendicular to the extending direction of the first L-shaped FPC 150. Further, in the following description, when simply the term "the width direction" is used in relation to a subject member (or part of a member), it refers to the direction perpendicular to the extending direction and the member thickness direction of the subject member (or part of the member).

More specifically, the length in the width direction of the body one-side part 150*a* and that of the body other-side part 150*b* excluding the FPC connecting-pad disposed parts 153, 154 are identical to each other, and the lengths in the width direction of the FPC connecting-pad disposed parts 153, 154 are greater than the foregoing lengths in the width direction.

Here, as described above, the first L-shaped FPC 150 includes the anode-dedicated equipotential region 22 and the cathode-dedicated equipotential region 23. Both of them function as conductive lines (conductive paths), and are partially exposed outside.

Specifically, the anode-dedicated equipotential region 22 is partially exposed on the press-bonded surface side of the first L-shaped FPC 150, whereby the anode-dedicated tile connecting pad 2A12 is formed. Further, the cathode-dedicated equipotential region 23 is partially exposed on the press-bonded surface side of the first L-shaped FPC 150, whereby the cathode-dedicated tile connecting pads 2A13 are formed. On the other hand, on the back surface side of the first L-shaped FPC 150, a pad-dedicated plate part 160b (which will be described in detail later) being part of the anode-dedicated equipotential region 22 is exposed, whereby the anode-side conductive part 70 is formed. Further, a pad-dedicated plate part 170b (which will be described in detail later) being part of the cathode-dedicated equipotential region 23 is exposed, whereby the cathode-side conductive part 71 is formed.

Firstly, on the press-bonded surface side of the first L-shaped FPC 150, on each of the body one-side part 150a and the body other-side part 150b, one anode-dedicated tile connecting pad 2A12 and two cathode-dedicated tile connecting pads 2A13 are respectively formed at the other portions being continuous to two FPC connecting-pad disposed parts 153, 154. That is, at the press-bonded surfaces of the two FPC connecting-pad disposed parts 153, 154 and the press-bonded surface of the curved continuous part 150c, none of the anode-dedicated tile connecting pad 2A12 and the cathode-dedicated tile connecting pads 2A13 are formed. In other words, at the press-bonded surfaces of the FPC connecting-pad disposed parts 153, 154, and at the press-bonded surface side of the curved continuous part 150c, none of the anode-dedicated equipotential regions 22 and the cathode-dedicated equipotential regions 23 are exposed outside.

The anode-dedicated tile connecting pad 2A12 and the cathode-dedicated tile connecting pads 2A13 are rectangular as seen in a plan view, and extend along the extending direction of the first L-shaped FPC 150. Further, the length in the longitudinal direction of the anode-dedicated tile connecting pad 2A12 is greater than the length in the longitudinal direction of each cathode-dedicated tile connecting pad 2A13.

In each of the body one-side part 150a and the body other-side part 150b, from an end where the FPC connecting-pad disposed part 153 (or the FPC connecting-pad disposed part 154) is positioned toward an end where the curved continuous part 150c is positioned, the first cathode-dedicated tile connecting pad 2A13, the anode-dedicated tile connecting pad 2A12, and the second cathode-dedicated tile connecting pad 2A13 are sequentially disposed. These pads are juxtaposed to each other while being spaced apart from each other.

Subsequently, as shown in FIG. 4, on the back surface side of the first L-shaped FPC 150, the anode-side conductive part 70 and the cathode-side conductive part 71 are formed at the positions corresponding to the back surfaces of the two FPC connecting-pad disposed parts 153, 154. In other words, on the back surface side of the first L-shaped FPC 150, at portions different from the two FPC connecting-pad disposed parts 153, 154, none of the anode-dedicated equipotential region 22 and the cathode-dedicated equipotential region 23 are exposed outside.

The anode-side conductive part 70 and the cathode-side conductive part 71 are each quadrangular (square) as seen in a plan view.

Here, a further detailed description will be given about the anode-dedicated equipotential region 22 and the cathode-dedicated equipotential region 23 of the first L-shaped FPC 150.

Note that, the anode-dedicated equipotential region 22 and the cathode-dedicated equipotential region 23 are each a film-like or thin-plate like portion, and the member thickness direction of each region is identical to the member thickness direction of the first L-shaped FPC 150.

Figure 7:
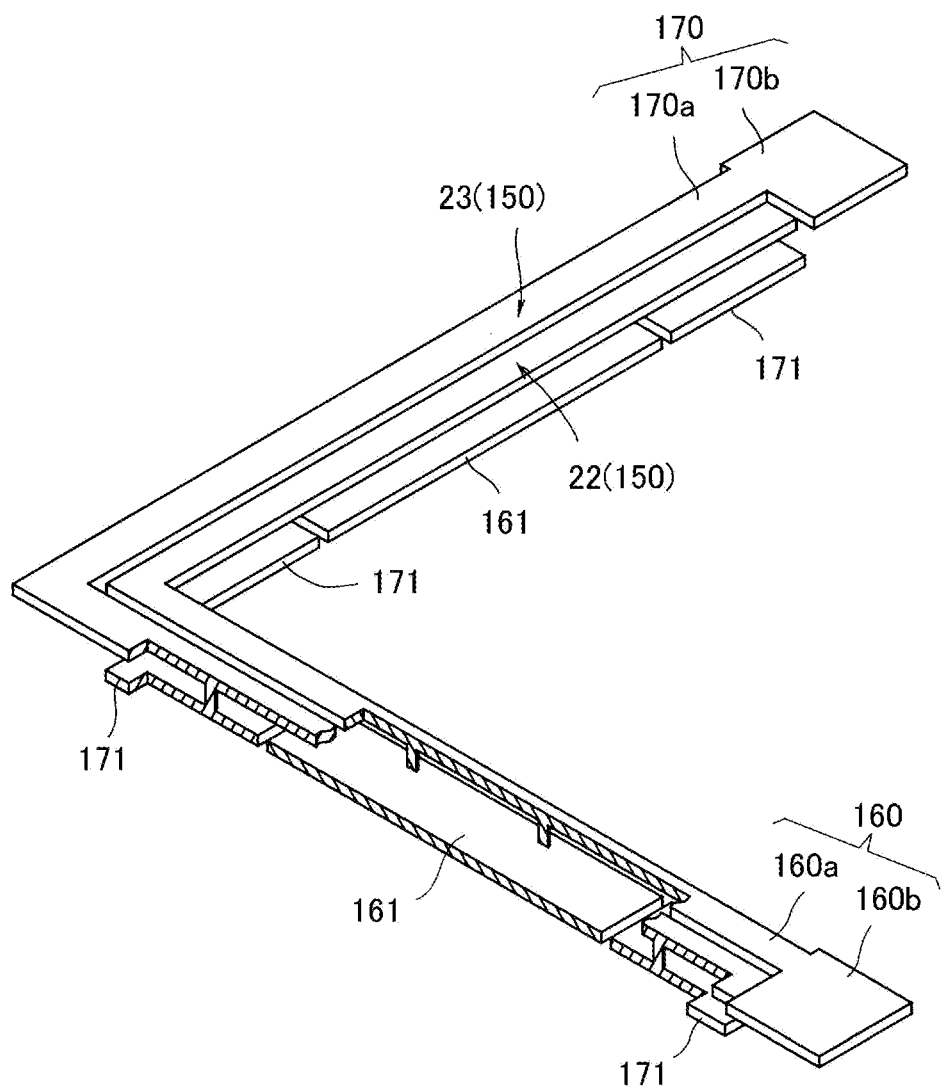
FIG. 7 is a partially cutaway perspective view schematically showing just an anode-dedicated equipotential region and a cathode-dedicated equipotential region of a first L-shaped FPC out of the set of two pieces of FPCs shown in FIG. 3.

The anode-dedicated equipotential region 22 includes an anode-dedicated coupling plate 160 (a front-side anode region) positioned on the back surface side (the upper side in FIG. 7) as shown in FIGS. 4 and 7, and two anode-dedicated pad forming plates 161 (contact surface-side anode regions) positioned on the press-bonded surface side (the lower side in FIG. 7) as shown in FIGS. 3 and 7. The anode-dedicated coupling plate 160 and the two anode-dedicated pad forming plates 161 are electrically connected to each other so as to be equipotential through a through hole or the like.

The cathode-dedicated equipotential region 23 includes a cathode-dedicated coupling plate 170 (a front-side cathode region) positioned on the back surface side (the upper side in FIG. 7) as shown in FIGS. 4 and 7, and four cathode-dedicated pad forming plates 171 (contact surface-side cathode regions) positioned on the press-bonded surface side (the lower side in FIG. 7) as shown in FIGS. 3 and 7. The cathode-dedicated coupling plate 170 and the four cathode-dedicated pad forming plates 171 are electrically connected to each other so as to be equipotential through a through hole or the like.

The anode-dedicated coupling plate 160 and the cathode-dedicated coupling plate 170 include a coupling plate body 160a (or a coupling plate body 170a) that extends to be L-shaped as seen in a plan view, and a pad-dedicated plate part 160b (or a pad-dedicated plate part 170b) positioned on one end in the extending direction of the coupling plate body 160a. The anode-dedicated coupling plate 160 and the cathode-dedicated coupling plate 170 are the portions where the coupling plate body 160a (or the coupling plate body 170a) and the pad-dedicated plate part 160b (or the pad-dedicated plate part 170b) are integrally formed.

Here, the two coupling plate bodies 160a, 170a are disposed, in the first L-shaped FPC 150, at the portions different from the FPC connecting-pad disposed parts 153, 154, and extend along the extending direction of the first L-shaped FPC 150.

On the other hand, the pad-dedicated plate parts 160b, 170b are each quadrangular (square) as seen in a plan view, and are respectively disposed at different FPC connecting-pad disposed parts 153, 154. The pad-dedicated plate parts 160b, 170b are each a wider planar spread portion as compared to other continuous portions. That is, the pad-dedicated plate parts 160b, 170b are greater in length in the width direction than the continuous portions.

Note that, the width direction as used herein is the width direction of the coupling plate bodies 160a, 170a.

Here, the two coupling plate bodies 160a, 170a extend so as to be parallel to each other.

More specifically, out of the two coupling plate bodies 160a, 170a, the coupling plate body 170a of the cathode-dedicated coupling plate 170 is disposed so as to be on the outer side relative to the coupling plate body 160a of the anode-dedicated coupling plate 160, when the planar light emitting device 100 is formed (see FIGS. 1A to 1C, 4, and 7).

Here, in order to avoid contact between the parts of the coupling plate body 170a of the cathode-dedicated coupling plate 170 positioned on the outer side and the parts of the coupling plate body 160a of the anode-dedicated coupling plate 160 positioned on the inner side, they are space apart from each other. That is, the parts of the coupling plate body 170a of the cathode-dedicated coupling plate 170 are positioned so as to be spaced apart outward from the coupling plate body 160a of the anode-dedicated coupling plate 160.

At the portion on the one end side in the extending direction of the first L-shaped FPC 150, the coupling plate body 160a and the pad-dedicated plate part 160b of the anode-dedicated coupling plate 160 become continuous to each other, and an end of the coupling plate body 170a of the cathode-dedicated coupling plate 170 and the pad-dedicated plate part 160b are spaced apart from each other.

On the other hand, on the other end side in the extending direction, the coupling plate body 170a of the cathode-dedicated coupling plate 170 and the pad-dedicated plate part 170b are continuous to each other, and an end of the coupling plate body 160a of the anode-dedicated coupling plate 160 and the pad-dedicated plate part 170b are spaced apart from each other.

Here, in the first L-shaped FPC 150, on the press-bonded surface side of the parts excluding the FPC connecting-pad disposed parts 153, 154, two anode-dedicated pad forming plates 161 and four cathode-dedicated pad forming plates 171 are disposed. These plates are rectangular flat plate-like parts extending in the longitudinal direction of the first L-shaped FPC 150.

Specifically, one anode-dedicated pad forming plate 161 and two cathode-dedicated pad forming plates 171 are disposed on the press-bonded surface side of the body one-side part 150a, and other anode-dedicated pad forming plate 161 and other two cathode-dedicated pad forming plates 171 are disposed on the press-bonded surface side of the body other-side part 150b.

In each of the body one-side part 150a and the body other-side part 150b, from one end side in the longitudinal direction to other end side thereof, the first cathode-dedicated pad forming plate 171, the anode-dedicated pad forming plate 161, and the second cathode-dedicated pad forming plate 171 are sequentially disposed. These elements are juxtaposed to each other while being spaced apart from each other.

The anode-dedicated pad forming plates 161 and the cathode-dedicated pad forming plates 171 are both disposed so as to be spaced apart from the two coupling plate bodies 160a, 170a toward the press-bonded surface side. The anode-dedicated pad forming plates 161 and the cathode-dedicated pad forming plates 171 are disposed so as to respectively overlap with the two coupling plate bodies 160a, 170a, while being spaced apart therefrom in the member thickness direction of the first L-shaped FPC 150 (the top-bottom direction in FIG. 7).

Accordingly, the anode-dedicated pad forming plates 161 and the cathode-dedicated pad forming plates 171 are disposed so as to partially overlap with one coupling plate body 160a, while being spaced apart therefrom in the member thickness direction of the first L-shaped FPC 150 (the top-bottom direction in FIG. 7). Further, the anode-dedicated pad forming plates 161 and the cathode-dedicated pad forming plates 171 are disposed so as to partially overlap with other coupling plate body 170a, while being spaced apart therefrom in the member thickness direction of the first L-shaped FPC 150 (the top-bottom direction in FIG. 7).

Further, the length of the two coupling plate bodies 160a, 170a in the width direction is smaller than that of the anode-dedicated pad forming plates 161 and the cathode-dedicated pad forming plates 171 which are spaced apart from the two coupling plate bodies 160a, 170a in the member thickness direction of the first L-shaped FPC 150 (the top-bottom direction in FIG. 7).

On the other hand, at a position being spaced apart from the two pad-dedicated plate parts 160b, 170b in the member thickness direction of the first L-shaped FPC 150 (the top-bottom direction in FIG. 7) (a position spaced apart toward the press-bonded surface side), none of the anode-dedicated pad forming plates 161 and the cathode-dedicated pad forming plates 171 are positioned.

Further, in the curved continuous part 150c also, as shown in FIGS. 4 and 7, at a position being spaced apart from the anode-dedicated coupling plates 160 and the cathode-dedicated coupling plates 170 toward the press-bonded surface side, none of the anode-dedicated pad forming plates 161 and the cathode-dedicated pad forming plates 171 are positioned.

Subsequently, a detailed description will be given about the second L-shaped FPC 151 that forms a pair with the first L-shaped FPC 150.

As shown in FIG. 3, the second L-shaped FPC 151 also is partially bent and extends so as to be L-shaped as seen in a plan view. Further, one FPC connecting-pad disposed part 155 is positioned at one end in the extending direction, and the other FPC connecting-pad disposed part 156 is positioned at the other end in the extending direction.

As shown in FIG. 3, these FPC connecting-pad disposed parts 155, 156 are respectively provided with an anode-side conductive part 72 and a cathode-side conductive part 73 which will be described later, to serve as portions where the FPC connecting pads 2A2, 2A3 are to be formed, respectively.

That is, the second L-shaped FPC 151 also includes a body one-side part 151a that extends linearly including the anode-dedicated FPC connecting-pad disposed part 155 positioned on one end side in the longitudinal direction as seen in a plan view, and a body-other side part 151b that extends linearly including the FPC connecting-pad disposed part 156 positioned on one end side in the longitudinal direction. Respective the other ends of these linearly extending portions are continuous to each other at a curved continuous part 151c.

In other words, respective other ends of the body one-side part 151a and the body other-side part 151b in the longitudinal direction are continuous to each other via the curved continuous part 151c. The extending direction of the body one-side part 151a and the extending direction of the body other-side part 151b are different from each other, and perpendicular to each other.

The body one-side part 151a is further provided with a power supplying terminal 40 that further projects inward from the edge portion which is positioned on the inner side when the planar light emitting device 100 is formed (see FIGS. 1A to 1C and 4).

Here, as to the length in the width direction of each part of the second L-shaped FPC 151, the length is greatest at the portion where the power supplying terminal 40 is formed, and the length is second greatest at the portion where the FPC connecting-pad disposed parts 155, 156 are positioned. The length is smallest in other parts.

Note that, the width direction as used herein is the width direction of the second L-shaped FPC 151.

Accordingly, the length in the width direction is slightly greater at the FPC connecting-pad disposed parts 155, 156 than at other continuous part.

As described above, the second L-shaped FPC 151 also includes the anode-dedicated equipotential region 22 and the cathode-dedicated equipotential region 23. Both of them function as conductive lines (conductive paths), and are partially exposed outside.

Specifically, as shown in FIG. 3, the anode-dedicated equipotential region 22 is partially exposed on the press-bonded surface side of the second L-shaped FPC 151, whereby the anode-side conductive part 72 and the anode-dedicated tile connecting pad 2A12 are formed. Further, the cathode-dedicated equipotential region 23 is partially exposed on the press-bonded surface side of the second L-shaped FPC 151, whereby the cathode-dedicated tile connecting pads 2A13 and the cathode-side conductive part 73 are formed.

As shown in FIG. 4, on the back surface side of the second L-shaped FPC 151, at the portion excluding the power supplying terminal 40, none of the anode-dedicated equipotential region 22 and the cathode-dedicated equipotential region 23 are exposed outside.

Firstly, on the press-bonded surface side of the body one-side part 151a, from an end where the FPC connecting-pad disposed part 155 is positioned toward the curved continuous part 151c, the anode-side conductive part 72, the first cathode-dedicated tile connecting pad 2A13, the anode-dedicated tile connecting pad 2A12, and the second cathode-dedicated tile connecting pad 2A13 are sequentially disposed. These elements are juxtaposed to each other while being spaced apart from each other in the longitudinal direction of the body one-side part 151a.

On the other hand, on the press-bonded surface side of the body other-side part 151b, from an end where the FPC connecting-pad disposed part 156 is positioned toward the curved continuous part 151c, one pad in which the cathode-side conductive part 73 and the first cathode-dedicated tile connecting pad 2A13 are integrated, the anode-dedicated tile connecting pad 2A12, and the second cathode-dedicated tile connecting pad 2A13 are sequentially disposed. These three pads are juxtaposed to each other while being spaced apart from each other in the longitudinal direction of the body other-side part 151b.

At the press-bonded surface of the curved continuous part 151c, none of the anode-dedicated equipotential region 22 and the cathode-dedicated equipotential region 23 are exposed outside. That is, none of the anode-side conductive part 72, the cathode-side conductive part 73, the anode-dedicated tile connecting pad 2A12, and the cathode-dedicated tile connecting pads 2A13 are formed.

More specifically, in the body one-side part 151a, the anode-side conductive part 72 is formed at the press-bonded surface of the FPC connecting-pad disposed part 155. The anode-side conductive part 72 is quadrangular (square) as seen in a plan view.

Further, at the portion which is part of the body one-side part 151a and positioned between the FPC connecting-pad disposed part 155 and the curved continuous part 150c, the anode-dedicated tile connecting pad 2A12 and the cathode-dedicated tile connecting pads 2A13 are positioned. The anode-dedicated tile connecting pad 2A12 and the cathode-dedicated tile connecting pads 2A13 are each rectangular extending in the longitudinal direction of the body one-side part 151a as seen in a plan view. The length in the longitudinal direction of the anode-dedicated tile connecting pad 2A12 is greater than the length in the longitudinal direction of each cathode-dedicated tile connecting pad 2A13.

On the other hand, on the press-bonded surface side of the body other-side part 151b, part of one pad is disposed at the press-bonded surface of the FPC connecting-pad disposed part 156, and other part of the pad is disposed on the press-bonded surface of a portion being continuous to the FPC connecting pad-disposed part 156. That is, one pad is formed across the FPC connecting-pad disposed part 156 and a portion being continuous to the FPC connecting-pad disposed part 156.

In this one pad, one portion disposed on the press-bonded surface of the FPC connecting-pad disposed part 156 serves as the cathode-side conductive part 73, and other portion serves as the cathode-dedicated tile connecting pad 2A13.

This one pad that forms the cathode-side conductive part 73 and the cathode-dedicated tile connecting pad 2A13 has a rectangular shape which is partially widened as seen in a plan view, the rectangular shape extending along the longitudinal direction of the body other-side part 151b. Here, the portion corresponding to the cathode-side conductive part 73 is longer in the width direction of the body other-side part 151b than other portion.

Further, the anode-dedicated tile connecting pad 2A12 and the cathode-dedicated tile connecting pad 2A13 formed at the body other-side part 151b each have a rectangular shape that extends in the longitudinal direction of the body other-side part 151b as seen in a plan view.

Here, as to the length in the longitudinal direction of these three pads as seen in a plan view, the length is greatest at the anode-dedicated tile connecting pad 2A12, and the length is second greatest at the one pad that forms the cathode-side conductive part 73 and the cathode-dedicated tile connecting pad 2A13. The length is smallest at the cathode-dedicated tile connecting pad 2A13.

Here, a further detailed description will be given about the anode-dedicated equipotential region 22 and the cathode-dedicated equipotential region 23 of the second L-shaped FPC 151.

Note that, the anode-dedicated equipotential region 22 and the cathode-dedicated equipotential region 23 are each a film-like or thin-plate like portion, and the member thickness direction of each region is identical to the member thickness direction of the second L-shaped FPC 151.

Figure 8:
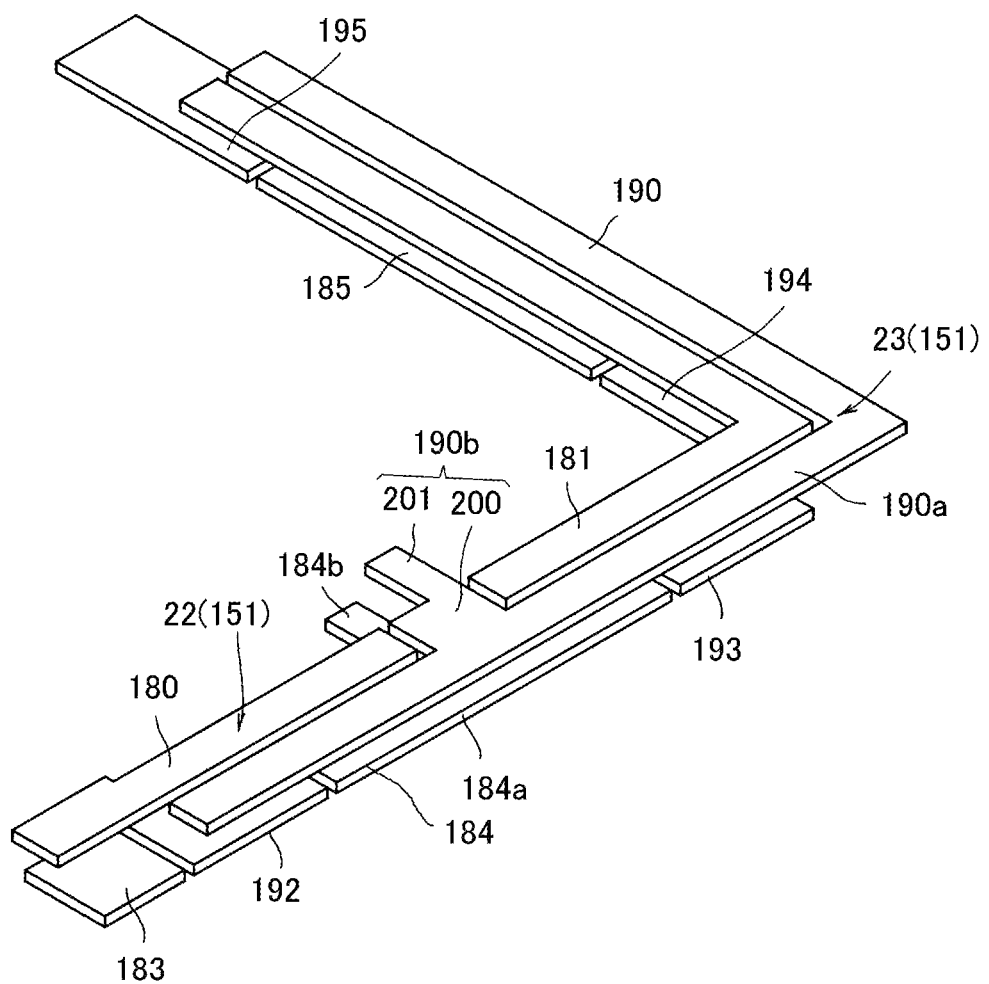
FIG. 8 is a perspective view schematically showing just an anode-dedicated equipotential region and a cathode-dedicated equipotential region of a second L-shaped FPC out of the set of two pieces of FPCs shown in FIG. 3.

As shown in FIGS. 4 and 8, the anode-dedicated equipotential region 22 of the second L-shaped FPC 151 includes a first anode-dedicated coupling plate 180 (a front-side anode region) and a second anode-dedicated coupling plate 181 (a front-side anode region) positioned on the back surface side (the upper side in FIG. 8). Further, as shown in FIGS. 3 and 8, the anode-dedicated equipotential region 22 includes a first anode-dedicated pad forming plate 183 (a contact surface-side anode region) and a second anode-dedicated pad forming plate 184 (a contact surface-side anode region), and a third anode-dedicated pad forming plate 185 (a contact surface-side anode region) positioned on the press-bonded surface side (the lower side in FIG. 8). The two coupling plates (the first anode-dedicated coupling plate 180 and the second anode-dedicated coupling plate 181) and the three pad forming plates (the first anode-dedicated pad forming plate 183, the second anode-dedicated pad forming plate 184, and the third anode-dedicated pad forming plate 185) are electrically connected to each other through a through hole or the like so as to be equipotential.

Figure 9:
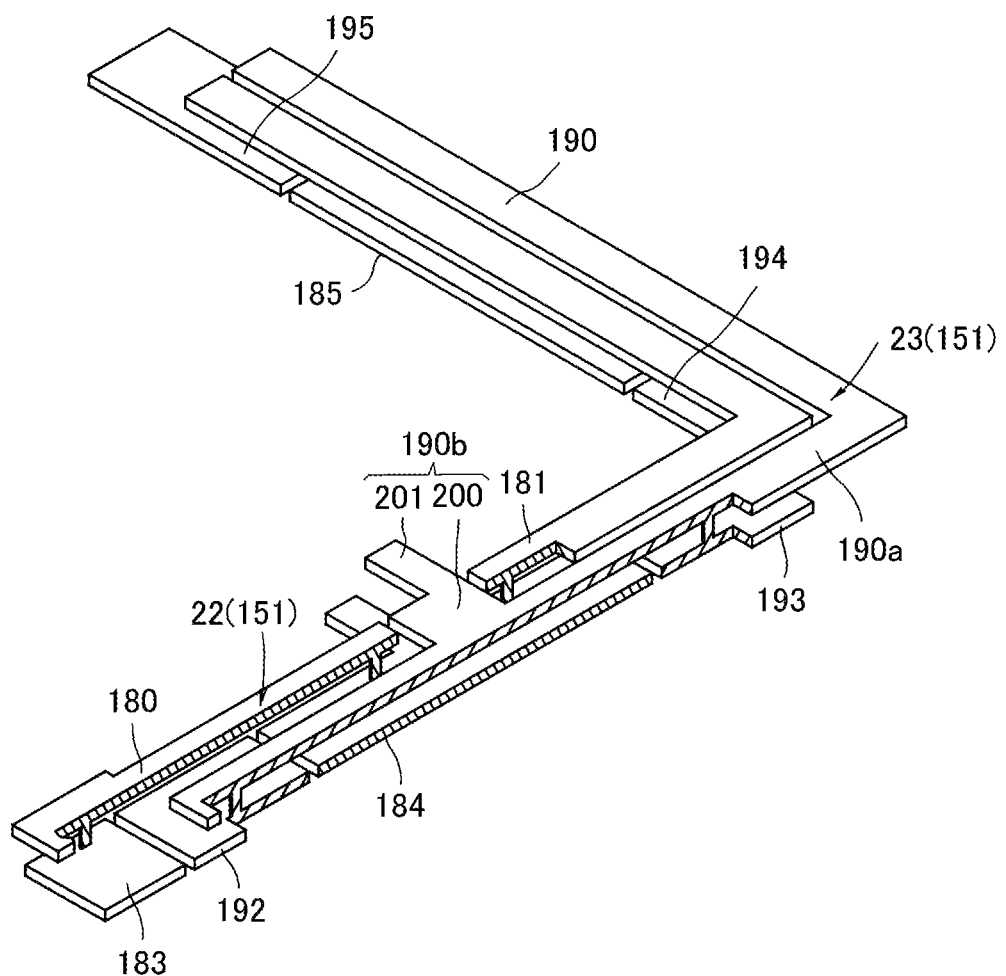
FIG. 9 is a partially cutaway perspective view schematically showing just the anode-dedicated equipotential region and the cathode-dedicated equipotential region of the second L-shaped FPC out of the set of two pieces of FPCs shown in FIG. 3.
Figure 10:
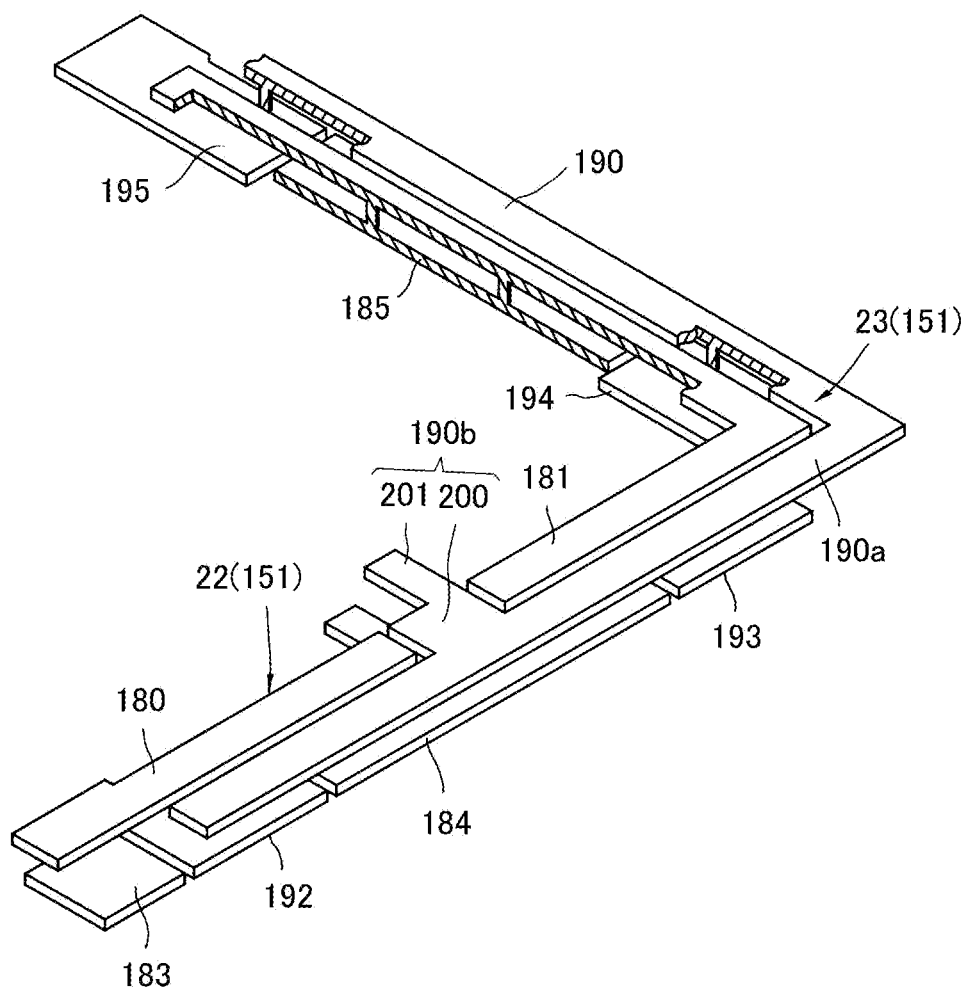
FIG. 10 is a partially cutaway perspective view schematically showing just the anode-dedicated equipotential region and the cathode-dedicated equipotential region of the second L-shaped FPC out of the set of two pieces of FPCs shown in FIG. 3, wherein the cutaway portion is different from that in FIG. 9.

More specifically, as shown in FIG. 9, the first anode-dedicated coupling plate 180 and the second anode-dedicated coupling plate 181 are both electrically connected to the second anode-dedicated pad forming plate 184. The first anode-dedicated coupling plate 180 is electrically connected also to the first anode-dedicated pad forming plate 183, in addition to the second anode-dedicated pad forming plate 184. Further, as shown in FIGS. 9 and 10, the second anode-dedicated coupling plate 181 is electrically connected also to the third anode-dedicated pad forming plate 185, in addition to the second anode-dedicated pad forming plate 184.

As shown in FIGS. 4 and 8, the cathode-dedicated equipotential region 23 of the second L-shaped FPC 151 includes a cathode-dedicated coupling plate 190 (a front-side cathode region) positioned on the back surface side (the upper side in FIG. 8). Further, as shown in FIGS. 3 and 8, the cathode-dedicated equipotential region 23 includes a first cathode-dedicated pad forming plate 192 (a contact surface-side cathode region), a second cathode-dedicated pad forming plate 193 (a contact surface-side cathode region), a third cathode-dedicated pad forming plate 194 (a contact surface-side cathode region), and a fourth cathode-dedicated pad forming plate 195 (a contact surface-side cathode region) positioned on the press-bonded surface side (the lower side in FIG. 8). As shown in FIGS. 9, 10 and others, the cathode-dedicated coupling plate 190 and the four pad forming plates (the first cathode-dedicated pad forming plate 192, the second cathode-dedicated pad forming plate 193, the third cathode-dedicated pad forming plate 194, and the fourth cathode-dedicated pad forming plate 195) are electrically connected to each other through a through hole or the like so as to be equipotential.

As shown in FIGS. 4 and 8, the first anode-dedicated coupling plate 180 has a linearly extending rectangular shape as seen in a plan view, the rectangular shape linearly extending from the central side in the longitudinal direction of the body one-side part 151*a* toward an end where the FPC connecting-pad disposed part 155 is positioned. In the first anode-dedicated coupling plate 180, the portion positioned at the end where the FPC connecting-pad disposed part 155 is positioned is slightly greater in length in the width direction as compared to other portions.

Note that, the width direction of the first anode-dedicated coupling plate 180 is identical to the width direction of the second L-shaped FPC 151 (the body one-side part 151*a*).

The second anode-dedicated coupling plate 181 is partially bent and extends so as to be L-shaped as seen in a plan view. Specifically, as shown in FIGS. 4 and 8, the second anode-dedicated coupling plate 181 linearly extends from the central side in the longitudinal direction of the body one-side part 151*a* to the curved continuous part 151*c* and is bent, and then extends along the longitudinal direction of the body other-side part 151*b*.

That is, the second anode-dedicated coupling plate 181 has a portion that extends along the longitudinal direction in the body one-side part 151*a* and a portion that extends in the longitudinal direction in the body other-side part 151*b*, and formed by such portions being continuous to each other.

As shown in FIG. 8, the cathode-dedicated coupling plate 190 includes a body part 190*a* that is partially bent and extends so as to be L-shaped as seen in a plan view, and a cathode-side terminal-dedicated plate part 190*b*. As shown in FIGS. 1A to 1C and 8, the cathode-side terminal-dedicated plate part 190*b* is a portion formed in the body part 190*a* to further project inward from the edge portion which is positioned on the inner side when the planar light emitting device 100 is formed.

As shown in FIG. 8, the cathode-side terminal-dedicated plate part 190*b* has a basal end part 200 having a great length in the width direction between the first anode-dedicated coupling plate 180 and the second anode-dedicated coupling plate 181, and a projecting plate part 201 that projects from the basal end part 200 in the direction which becomes the inner side when the planar light emitting device 100 is formed. More specifically, the projecting plate part 201 projects from a position of the second anode-dedicated coupling plate 181 side in the basal end part 200.

Further, as shown in FIG. 4, the cathode-side terminal-dedicated plate part 190*b* is provided across the substantially central portion in the longitudinal direction of the body one-side part 151*a* and the portion where the power supplying terminal 40 is formed.

Here, in the first anode-dedicated coupling plate 180, a portion excluding the widened substantial end portion and the body part 190*a* of the cathode-dedicated coupling plate 190 extend in parallel to each other. Further, the second anode-dedicated coupling plate 181 and the body part 190*a* of the cathode-dedicated coupling plate 190 extend in parallel to each other.

That is, the body part 190*a* of the cathode-dedicated coupling plate 190 is disposed so as to be on the outer side relative to the portion of the first anode-dedicated coupling plate 180 excluding the widened substantially end portion, when the planar light emitting device 100 is formed. Further, the body part 190*a* of the cathode-dedicated coupling plate 190 is disposed so as to be on the outer side relative to the second anode-dedicated coupling plate 181, when the planar light emitting device 100 is formed.

Between the body part 190*a* of the cathode-dedicated coupling plate 190 and part of the first anode-dedicated coupling plate 180 and the second anode-dedicated coupling plate 181 positioned on the inner side relative to the body part 190*a*, space is formed so as to avoid contact between them.

More specifically, as shown in FIG. 3 and others, in the body one-side part 151*a*, between a portion slightly on the center side in the longitudinal direction relative to the FPC connecting-pad disposed part 155 and a position slightly on the FPC connecting-pad disposed part 155 side relative to the position where the cathode-side terminal-dedicated plate part 190*b* is positioned, part of the first anode-dedicated coupling plate 180 and the body part 190*a* of the cathode-dedicated coupling plate 190 extend in parallel to each other.

Further, in the second L-shaped FPC 151, in a portion that extends across the body one-side part 151*a* and the body other-side part 151*b*, the second anode-dedicated coupling plate 181 and the body part 190*a* of the cathode-dedicated coupling plate 190 extend in parallel to each other.

That is, the second anode-dedicated coupling plate 181 and the body part 190*a* of the cathode-dedicated coupling plate 190 extend, from the substantially central portion in the longitudinal direction of the body one-side part 151*a* to the substantially end portion where the FPC connecting-pad disposed part 156 of the body other-side part 151*b* is positioned via the curved continuous part 151*c*. Note that, "the substantially central portion in the longitudinal direction of the body one-side part 151*a*" as used herein refers to the position slightly on the curved continuous part 151*c* side relative to the portion where the cathode-side terminal-dedicated plate part 190*b* is positioned. Further, "the substantially end portion where the FPC connecting-pad disposed part 156 is positioned" refers to the position slightly on the curved continuous part 151*c* side relative to the portion where the FPC connecting-pad disposed part 156 is positioned.

The second anode-dedicated coupling plate 181 and the body part 190a of the cathode-dedicated coupling plate 190 linearly extend in parallel to each other while being spaced apart from each other in the body one-side part 151a. The second anode-dedicated coupling plate 181 and the body part 190a of the cathode-dedicated coupling plate 190 are both bent at the curved continuous part 151c while maintaining the spaced-apart and parallel state, and extend linearly in the body other-side part 151b while maintaining the spaced-apart and parallel state.

Figure 11:
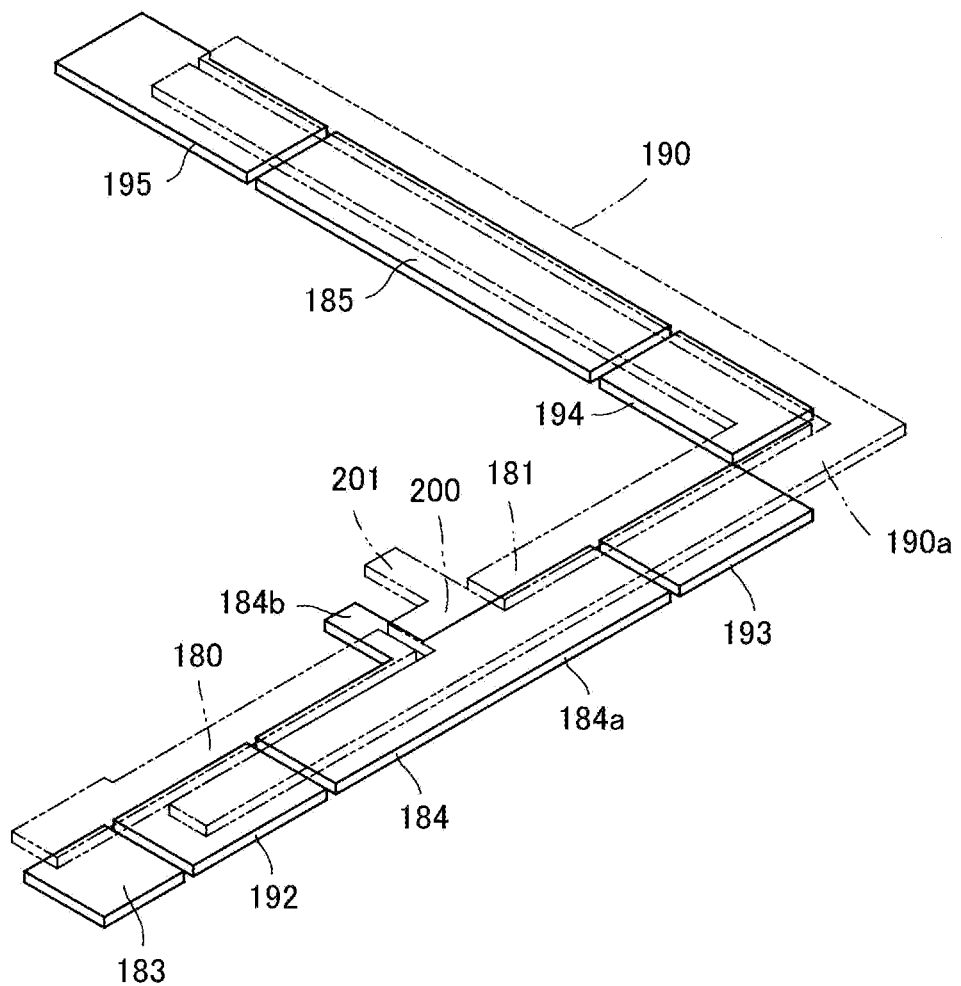
FIG. 11 is a perspective view schematically showing just the anode-dedicated equipotential region and the cathode-dedicated equipotential region of the second L-shaped FPC out of the set of two pieces of FPCs shown in FIG. 3, wherein the portion positioned on the back surface side is shown in a transparent manner.

As shown in FIGS. 8 and 11, the first anode-dedicated pad forming plate 183 is quadrangular (square) as seen in a plan view, and positioned on the press-bonded surface side of the FPC connecting-pad disposed part 155.

Figure 12:
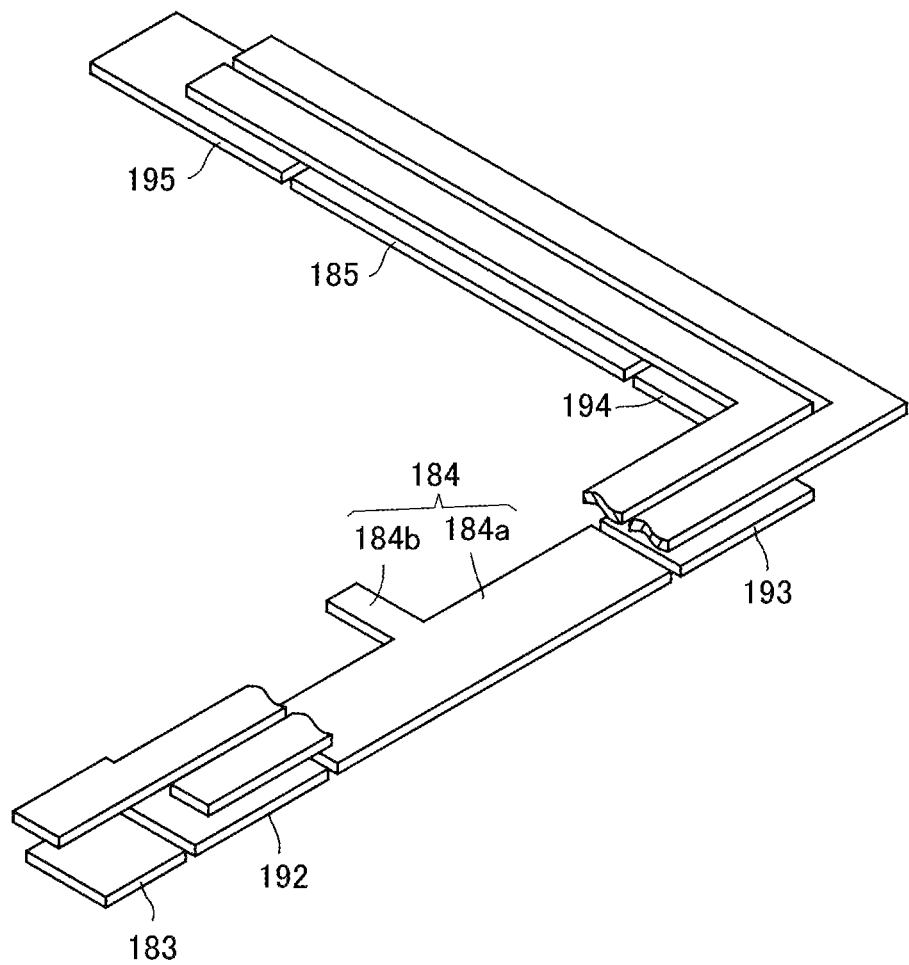
FIG. 12 is a partially cutaway perspective view schematically showing just the anode-dedicated equipotential region and the cathode-dedicated equipotential region of the second L-shaped FPC out of the set of two pieces of FPCs shown in FIG. 3, wherein the cutaway portion is different from that in FIGS. 9 and 10.

As shown in FIGS. 8 and 12, the second anode-dedicated pad forming plate 184 is a substantially convex polygonal shape as seen in a plan view. The second anode-dedicated pad forming plate 184 has a pad forming plate part 184a and an anode-side terminal-dedicated plate part 184b.

The pad forming plate part 184a is rectangular as seen in a plan view, extending along the longitudinal direction of the body one-side part 151a.

The anode-side terminal-dedicated plate part 184b is a portion, in the pad forming plate part 184a, that further projects inward (the upper left side in FIG. 12) from an edge portion positioned on the inner side when the planar light emitting device 100 is formed. That is, the anode-side terminal-dedicated plate part 184b is rectangular as seen in a plan view extending along the direction (the longitudinal direction of the body other-side part 151b) perpendicular to the longitudinal direction of the body one-side part 151a.

As shown in FIGS. 8 and 11, the third anode-dedicated pad forming plate 185 is rectangular as seen in a plan view extending along the longitudinal direction of the body other-side part 151b.

The first cathode-dedicated pad forming plate 192 and the second cathode-dedicated pad forming plate 193 are rectangular as seen in a plan view extending along the body one-side part 151a, and the third cathode-dedicated pad forming plate 194 is rectangular as seen in a plan view extending along the body other-side part 151b. The fourth cathode-dedicated pad forming plate 195 has a partially widened rectangular shape as seen in a plan view, extending along the body other-side part 151b.

Here, in the body one-side part 151a, on the press-bonded surface side, from an end where the FPC connecting-pad disposed part 155 is positioned toward an end where the curved continuous part 151c is positioned, the first anode-dedicated pad forming plate 183, the first cathode-dedicated pad forming plate 192, the pad forming plate part 184a, and the second cathode-dedicated pad forming plate 193 are sequentially disposed. These elements are juxtaposed to each other while being spaced apart from each other along the longitudinal direction of the body one-side part 151a.

On the other hand, in the body other-side part 151b, on the press-bonded surface side, from an end where the curved continuous part 151c is positioned toward an end where the FPC connecting-pad disposed part 156 is positioned, the third cathode-dedicated pad forming plate 194, the third anode-dedicated pad forming plate 185, and the fourth cathode-dedicated pad forming plate 195 are sequentially disposed. These elements are juxtaposed to each other while being spaced apart from each other along the longitudinal direction of the body other-side part 151b.

Here, the pad forming plates (the first anode-dedicated pad forming plate 183, the second anode-dedicated pad forming plate 184, the third anode-dedicated pad forming plate 185, the first cathode-dedicated pad forming plate 192, the second cathode-dedicated pad forming plate 193, the third cathode-dedicated pad forming plate 194, and the fourth cathode-dedicated pad forming plate 195) are disposed so as to overlap with at least one of part of the first anode-dedicated coupling plate 180, part of the second anode-dedicated coupling plate 181, and part of the cathode-dedicated coupling plate 190, while being spaced apart therefrom in the member thickness direction of the second L-shaped FPC 151 (the top-bottom direction in FIG. 8).

That is, as shown in FIGS. 4 and 8, in the body one-side part 151a, at an end where the FPC connecting-pad disposed part 155 is positioned, the first anode-dedicated pad forming plate 183 is disposed at a position spaced apart toward the press-bonded surface side from the widened portion of the first anode-dedicated coupling plate 180.

That is, the first anode-dedicated pad forming plate 183 overlaps with part of the first anode-dedicated coupling plate 180 while being spaced apart therefrom in the member thickness direction of the second L-shaped FPC 151, and the first anode-dedicated pad forming plate 183 does not overlap with the second anode-dedicated coupling plate 181 and the cathode-dedicated coupling plate 190 in this member thickness direction.

Note that, the length in the width direction of the widened portion of the first anode-dedicated coupling plate 180 is smaller than the length in the same direction of the first anode-dedicated coupling plate 180.

Further, as shown in FIGS. 4 and 8, in the body one-side part 151a, at a position adjacent to the FPC connecting-pad disposed part 155, the first cathode-dedicated pad forming plate 192 is disposed at a position spaced apart toward the press-bonded surface side from part of the first anode-dedicated coupling plate 180 and part of the cathode-dedicated coupling plate 190 (part of the body part 190a) extending in parallel to each other.

That is, the first cathode-dedicated pad forming plate 192 does not overlap with the second anode-dedicated coupling plate 181 in the member thickness direction of the second L-shaped FPC 151.

Note that, the length in the width direction of part of the first anode-dedicated coupling plate 180 and the length in the width direction of part of the cathode-dedicated coupling plate 190 that overlap with the first cathode-dedicated pad forming plate 192 while being spaced apart therefrom are smaller in total than the length in the same direction of the first cathode-dedicated pad forming plate 192.

In the body one-side part 151a, as shown in FIGS. 4 and 8, at a position around the center in the longitudinal direction, on the back surface side, part of the first anode-dedicated coupling plate 180, part of the body part 190a of the cathode-dedicated coupling plate 190, the basal end part 200 of the cathode-side terminal-dedicated plate part 190b, and part of the second anode-dedicated coupling plate 181 are positioned. The pad forming plate part 184a of the second anode-dedicated pad forming plate 184 is positioned to be spaced apart toward the press-bonded surface side from the foregoing elements.

That is, the second anode-dedicated pad forming plate 184 overlaps with part of the first anode-dedicated coupling plate 180, part of the cathode-dedicated coupling plate 190, and part of the second anode-dedicated coupling plate 181, while being spaced apart therefrom in the member thickness direction of the second L-shaped FPC 151.

Note that, the length in the width direction of part of the first anode-dedicated coupling plate 180, the length in the width direction of the body part of the cathode-dedicated coupling plate 190, and the length in the width direction of the second anode-dedicated coupling plate 181 that overlap with the second anode-dedicated pad forming plate 184 while being spaced apart therefrom are all smaller than the length in the same direction of the second anode-dedicated pad forming plate 184.

Further, the basal end part 200 of the cathode-side terminal-dedicated plate part 190b is positioned between an end in the extending direction of the first anode-dedicated coupling plate 180 and an end in the extending direction of the second anode-dedicated coupling plate 181, that is, between respective ends of the first anode-dedicated coupling plate 180 and the second anode-dedicated coupling plate 181 that are positioned on the central side in the longitudinal direction of the body one-side part 151a.

The anode-side terminal-dedicated plate part 184b is positioned on the lateral side of a position which is spaced apart from the cathode-side terminal-dedicated plate part 190b toward the press-bonded surface side. In other words, the anode-side terminal-dedicated plate part 184b and the cathode-side terminal-dedicated plate part 190b do not overlap with each other in the member thickness direction of the second L-shaped FPC 151.

In the body one-side part 151a, as shown in FIGS. 4 and 8, at a position adjacent to the curved continuous part 151c, the second cathode-dedicated pad forming plate 193 is disposed so as to be spaced apart toward the press-bonded surface side from part of the second anode-dedicated coupling plate 181 and part of the cathode-dedicated coupling plate 190 (part of the body part 190a) extending in parallel to each other.

That is, the second cathode-dedicated pad forming plate 193 does not overlap with the first anode-dedicated coupling plate 180 in the member thickness direction of the second L-shaped FPC 151.

Note that, the length in the width direction of part of the second anode-dedicated coupling plate 181 and the length in the width direction of part of the cathode-dedicated coupling plate 190 that overlap with the second cathode-dedicated pad forming plate 193 while being spaced apart therefrom are smaller in total than the length in the same direction of the second cathode-dedicated pad forming plate 193.

As shown in FIGS. 4 and 8, in the curved continuous part 151c, at positions spaced apart toward the press-bonded surface side from the first anode-dedicated coupling plate 180 and the cathode-dedicated coupling plate 190 positioned on the back surface side, none of the pad forming plates (the two anode-dedicated pad forming plates and the four cathode-dedicated pad forming plates) are positioned.

As shown in FIGS. 4 and 8, in the body other-side part 151b, at a position adjacent to the curved continuous part 151c, the third cathode-dedicated pad forming plate 194 is disposed so as to be spaced apart toward the press-bonded surface side from part of the second anode-dedicated coupling plate 181 and part of the cathode-dedicated coupling plate 190 (part of the body part 190a) extending in parallel to each other.

That is, the third cathode-dedicated pad forming plate 194 does not overlap with the first anode-dedicated coupling plate 180 in the member thickness direction of the second L-shaped FPC 151.

Note that, the length in the width direction of part of the second anode-dedicated coupling plate 181 and the length in the width direction of part of the cathode-dedicated coupling plate 190 that overlap with the third cathode-dedicated pad forming plate 194 while being spaced apart therefrom are smaller in total than the length in the same direction of the third cathode-dedicated pad forming plate 194.

As shown in FIGS. 4 and 8, in the body other-side part 151b, at a position around the center in the longitudinal direction, the third anode-dedicated pad forming plate 185 is disposed so as to be spaced apart toward the press-bonded surface side from part of the second anode-dedicated coupling plate 181 and part of the cathode-dedicated coupling plate 190 (part of the body part 190a) extending in parallel to each other.

That is, the third anode-dedicated pad forming plate 185 does not overlap with the first anode-dedicated coupling plate 180 in the member thickness direction of the second L-shaped FPC 151.

Note that, the length in the width direction of part of the second anode-dedicated coupling plate 181 and the length in the width direction of part of the cathode-dedicated coupling plate 190 that overlap with the third anode-dedicated pad forming plate 185 while being spaded apart therefrom are smaller in total than the length in the same direction of the third anode-dedicated pad forming plate 185.

As shown in FIGS. 4 and 8, in the body one-side part 151a, at a position adjacent to the FPC connecting-pad disposed part 156, part of the fourth cathode-dedicated pad forming plate 195 (the portion positioned toward the third anode-dedicated pad forming plate 185) is disposed so as to be spaced apart toward the press-bonded surface side from part of the second anode-dedicated coupling plate 181 and part of the cathode-dedicated coupling plate 190 (part of the body part 190a) extending in parallel to each other.

That is, the fourth cathode-dedicated pad forming plate 195 does not overlap with the first anode-dedicated coupling plate 180 in the member thickness direction of the second L-shaped FPC 151. Further, at the widened portion of the fourth cathode-dedicated pad forming plate 195 which is disposed in the FPC connecting-pad disposed part 156, none of the first anode-dedicated coupling plate 180, the second anode-dedicated coupling plate 181, and the cathode-dedicated coupling plate 190 are positioned as being spaced apart in the member thickness direction of the second L-shaped FPC 151 (the top-bottom direction in FIG. 11).

Note that, the length in the width direction of part of the second anode-dedicated coupling plate 181 and the length in the width direction of part of the cathode-dedicated coupling plate 190 that overlap with the fourth cathode-dedicated pad forming plate 195 while being spaced apart therefrom are shorter in total than the length in the same direction of the fourth cathode-dedicated pad forming plate 195.

Figure 13:
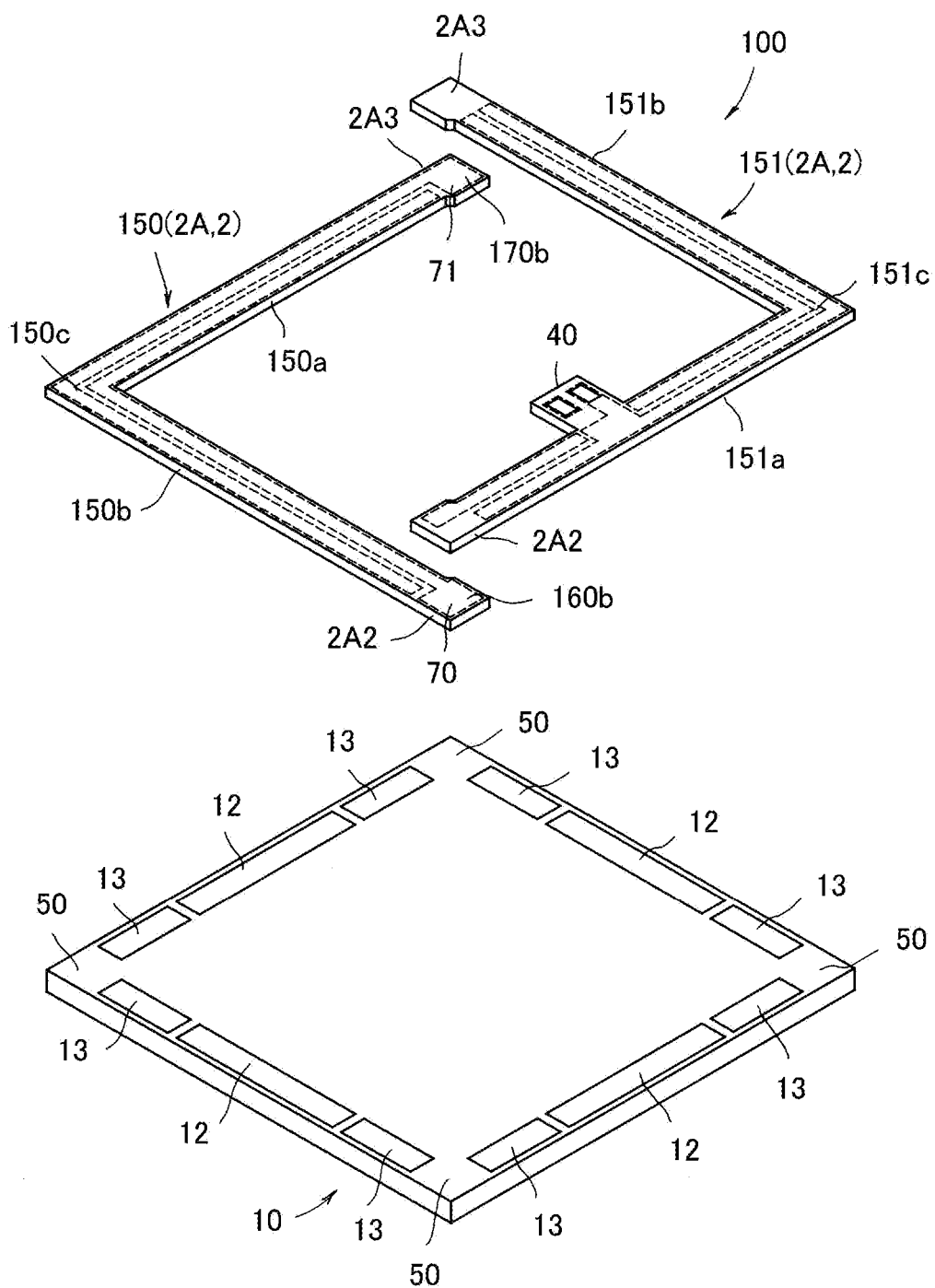
FIG. 13 is an explanatory diagram showing a manner of forming a planar light emitting device employing the set of two pieces of FPCs shown in FIG. 3, showing the state before the FPCs are mounted.
Figure 14:
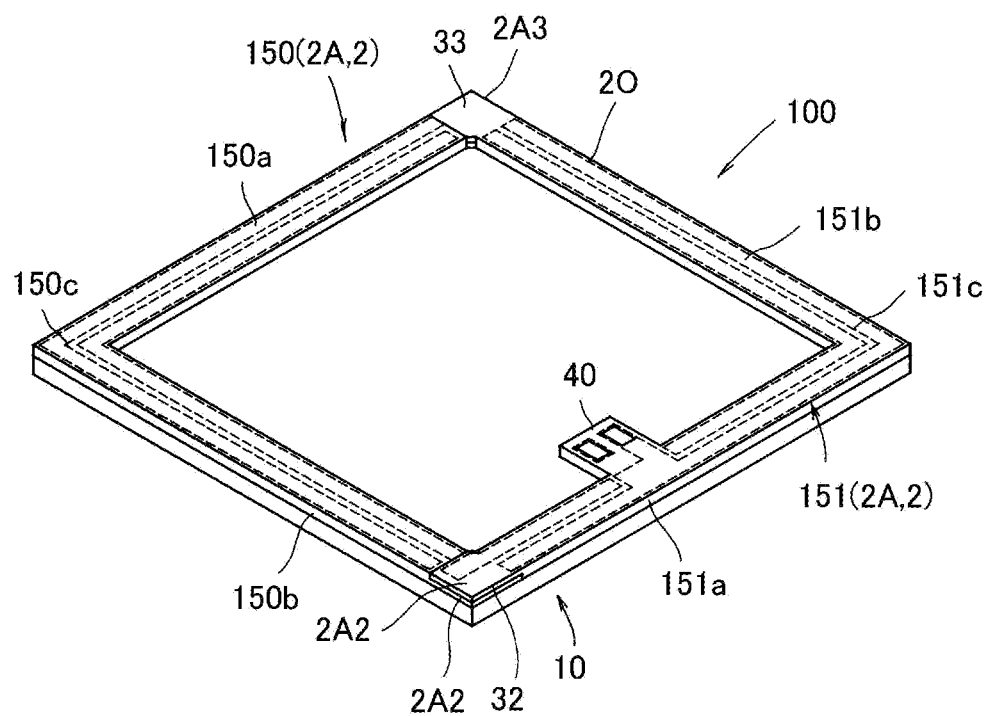
FIG. 14 is an explanatory diagram showing the manner of forming a planar light emitting device employing the set of two pieces of FPCs subsequently to FIG. 13, showing the state after the FPCs are mounted.

As shown in FIGS. 13 and 14, the first L-shaped FPC 150 is integrally mounted on the back surface of the planar light emitting tile 10, and further the second L-shaped FPC 151 is mounted thereon. Thus, the planar light emitting device 100 is manufactured.

At this time, the anode-dedicated FPC connecting pad 2A2, the cathode-dedicated FPC connecting pad 2A3, and the curved continuous part 150c of the first L-shaped FPC 150 are respectively disposed on and directly in contact with different connecting-part disposed regions 50.

Further, the anode-dedicated tile connecting pad 2A12 (see FIG. 3 and others) and the cathode-dedicated tile connecting pads 2A13 formed at the first L-shaped FPC 150 are respectively disposed on and directly in contact with the anode pad 12 and the cathode pads 13 formed on the planar light emitting tile 10.

From the outer side over the back surface, when the planar light emitting device 100 is formed, the second L-shaped FPC 151 is brought near to a structure made up of the first L-shaped FPC 150 being mounted on the back surface of the planar light emitting tile 10, and then mounted on the structure.

At this time, the anode-dedicated FPC connecting pad 2A2 of the second L-shaped FPC 151 is mounted on the anode-dedicated FPC connecting pad 2A2 of the first L-shaped FPC 150. Further, the cathode-dedicated FPC connecting pad 2A3 of the second L-shaped FPC 151 is mounted on the cathode-dedicated FPC connecting pad 2A3 of the first L-shaped FPC 150.

The curved continuous part 151c of the second L-shaped FPC 151 is disposed on one connecting-part disposed region 50 of the planar light emitting tile 10, on which none of elements of the first L-shaped FPC 150 are disposed.

Further, by the anode-dedicated FPC connecting pad 2A2 of the first L-shaped FPC 150 and the anode-dedicated FPC connecting pad 2A2 of the second L-shaped FPC 151 overlapping with each other, the anode-side conductive part 70 positioned on the back surface side of the first L-shaped FPC 150 (see FIG. 3) and the anode-side conductive part 72 positioned at the press-bonded surface of the second L-shaped FPC 151 (see FIG. 4) are in direct contact with each other.

Thus, the anode-dedicated equipotential region 22 of the first L-shaped FPC 150 and the anode-dedicated equipotential region 22 of the second L-shaped FPC 151 are electrically connected to each other. That is, one electrical connection site 32 is formed.

Similarly, by the cathode-dedicated FPC connecting pad 2A3 of the first L-shaped FPC 150 and the cathode-dedicated FPC connecting pad 2A3 of the second L-shaped FPC 151 overlapping with each other, the cathode-side conductive part 71 positioned on the back surface side of the first L-shaped FPC 150 (see FIG. 3) and the cathode-side conductive part 73 positioned at the press-bonded surface of the second L-shaped FPC 151 (see FIG. 4) are in direct contact with each other.

Thus, the cathode-dedicated equipotential region 23 of the first L-shaped FPC 150 and the cathode-dedicated equipotential region 23 of the second L-shaped FPC 151 are electrically connected to each other. That is, other electrical connection site 33 is formed.

That is, in one first L-shaped FPC 150, just on the back surface side of the two FPC connecting-pad disposed parts 153, 154, the anode-side conductive part 70 and the cathode-side conductive part 71 are disposed. In other second L-shaped FPC 151, just on the press-bonded surface side of the two FPC connecting-pad disposed parts 155, 156, the anode-side conductive part 72 and the cathode-side conductive part 73 are disposed.

The electrical connection sites 32, 33 formed by overlapped two FPC connecting pads 2A2, 2A3 are formed in a plurality of numbers, and are respectively positioned on the connecting-part disposed regions 50.

Further, the curved continuous parts 151c of respective FPCs 2 are also respectively positioned on the connecting-part disposed regions 50, in direct contact therewith.

The anode-dedicated tile connecting pads 2A12 (see FIG. 3 and others) and the cathode-dedicated tile connecting pads 2A13 formed at the second L-shaped FPC 151 are also respectively positioned on the anode pads 12 and the cathode pads 13 formed on the planar light emitting tile 10, in direct contact therewith.

That is, in the present embodiment, two FPCs 2 each having portions that are brought into contact with the anode pads 12 and the cathode pads 13 of the planar light emitting tile 10 are coupled to each other, whereby the square-annular shaped FPC 2O is formed.

(One-End Both Electrode Connection FPC 2B)

FIG. 6A shows four one-end both electrode connection FPCs 2B which are a set of four pieces of FPCs 2 that are applicable to the planar light emitting tile 10 shown in FIG. 2 and the back surface of the planar light emitting tile 10 shown in FIG. 2, and is a plan view showing an appearance before the FPCs 2 are mounted. FIG. 6B is a plan view showing the stage after two FPCs 2 are mounted. FIG. 6C is a plan view showing the stage after four FPCs 2 are mounted. Note that, the plan view of FIG. 6A includes partial detail views in the plan view of FIG. 6B.

As shown in FIGS. 6A to 6C, the one-end both electrode connection FPC 2B is at least one of a plurality of FPCs 2 used in the planar light emitting device 100. As for the plurality of FPCs 2, when four one-end both electrode connection FPCs 2B are employed, each one-end both electrode connection FPC 2B has a conductive path with conductibility in one direction as a whole. That is, the one-end both electrode connection FPC 2B has the anode-dedicated equipotential region 22 and the cathode-dedicated equipotential region 23, and functions as a conductive path conducted in one direction as a whole. Further, the one-end both electrode connection FPC 2B has one-end both electrode connection sites 3BC.

Each one-end both electrode connection site 3BC is provided at least at an end in one direction of the conductive path, and includes two FPC connecting pads 2B2, 2B3. These two FPC connecting pads 2B2, 2B3 respectively serve as two electrical connection sites 32, 33. That is, one FPC connecting pad 2B2 is part of one electrical connection site 32, and other FPC connecting pad 2B3 is part of other electrical connection site 33.

That is, the two FPC connecting pads 2B2, 2B3 are also the anode-dedicated FPC connecting pad 2B2 and the cathode-dedicated FPC connecting pad 2B3, respectively. Further, the anode-dedicated FPC connecting pad 2B2 is also part of the anode-dedicated equipotential region 22, and the cathode-dedicated FPC connecting pad 2B3 is also part of the cathode-dedicated equipotential region 23.

In the following, with reference to FIGS. 6A to 6C, a description will be given about a specific example in which such one-end both electrode connection sites 3BC are used in supplying power to the planar light emitting tile 10.

FIG. 6A is a plan view showing the appearance of a set of four pieces of FPCs 2 that is applicable to the planar light emitting tile 10 shown in FIG. 2, and the back surface of the planar light emitting tile 10 shown in FIG. 2. These four FPCs 2 are each an I-shaped FPC, and also is a one-end both electrode connection FPC 2B. These four FPCs 2 form the above-described square-annular shaped FPC 2O.

Further, the four one-end both electrode connection FPCs 2B each have the anode-dedicated equipotential region 22 and the cathode-dedicated equipotential region 23. The one-end both electrode connection FPCs 2B each have, as part of the anode-dedicated equipotential region 22 and part of the cathode-dedicated equipotential region 23, an anode-dedicated tile connecting pad 2B12 and cathode-dedicated tile connecting pads 2B13 (see FIG. 15). The anode-dedicated tile connecting pad 2B12 and the cathode-dedicated tile connecting pads 2B13 correspond to the anode pad 12 and the cathode pads 13 of the planar light emitting tile 10 shown in FIG. 2.

Further, the four one-end both electrode connection FPCs 2B are each provided with anode-dedicated FPC connecting pads 2B2 and cathode-dedicated FPC connecting pads 2B3 for connecting between the FPCs 2. Specifically, a set of two pads being one anode-dedicated FPC connecting pad 2B2 and one cathode-dedicated FPC connecting pad 2B3 is provided at each end of each one-end both electrode connection FPC 2B. That is, for each FPC 2, two pairs of four pads are provided. For the four FPCs 2, 16 pads in total are provided.

These four one-end both electrode connection FPCs 2B can be applied to the planar light emitting tile 10 shown in FIG. 2 according to the mounting stages shown in FIGS. 6B and 6C.

A further specific description will be given about the four one-end both electrode connection FPCs 2B.

The four one-end both electrode connection FPCs 2B are a set of four pieces of FPCs 2, and form one square-annular shaped FPC 2P (an annular circuit board) as shown in FIGS. 6A to 6C. The four one-end both electrode connection FPCs 2B include one one-end both electrode connection FPC 2B provided with the power supplying terminal 40 (hereinafter also referred to as the first I-shaped FPC 210).

Further, the four one-end both electrode connection FPCs 2B include, as other one, a one-end both electrode connection FPC 2B that is not brought into contact with the first I-shaped FPC 210 when the planar light emitting device 100 is formed (hereinafter also referred to as the second I-shaped FPC 211).

Still further, the four one-end both electrode connection FPCs 2B include, as other two, two one-end both electrode connection FPCs 2B that are brought into contact with both of the first I-shaped FPC 210 and the second I-shaped FPC 211 when the planar light emitting device 100 is formed, and extend from one end in the longitudinal direction to other end in the longitudinal direction (hereinafter also referred to as the third I-shaped FPCs 212).

As shown in FIGS. 6A to 6C, the first I-shaped FPC 210 linearly extends so as to be I-shaped as seen in a plan view. The power supplying terminal 40 is provided so as to project further inward from the edge portion positioned on the inner side when the planar light emitting device 100 is formed.

Figure 15:
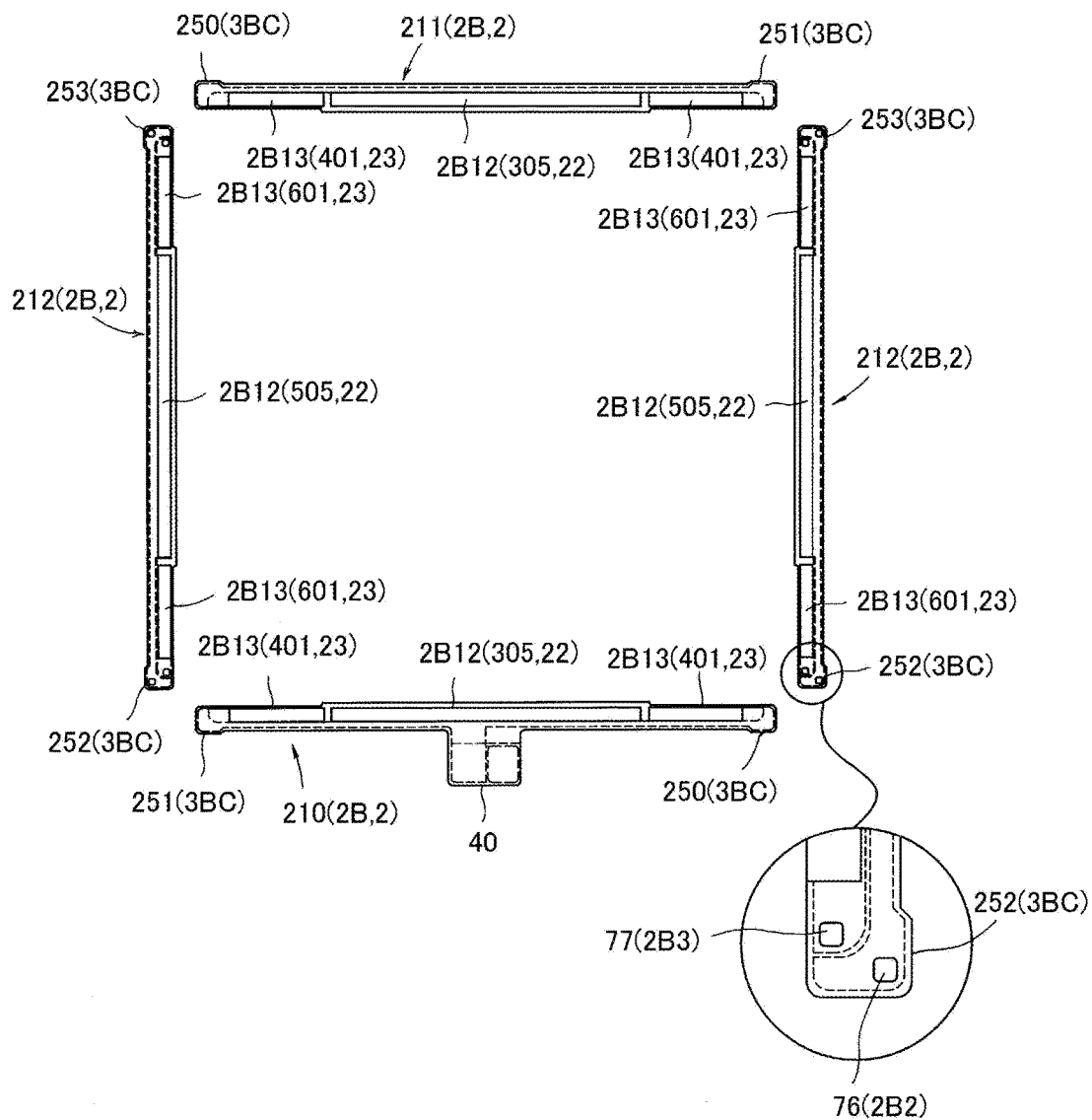
FIG. 15 shows one embodiment of the set of four pieces of FPCs shown in FIGS. 6A to 6C, showing a plan view of a set of four pieces of FPCs as seen from the press-bonded surface side to be in contact with a planar light emitting tile.
Figure 16:
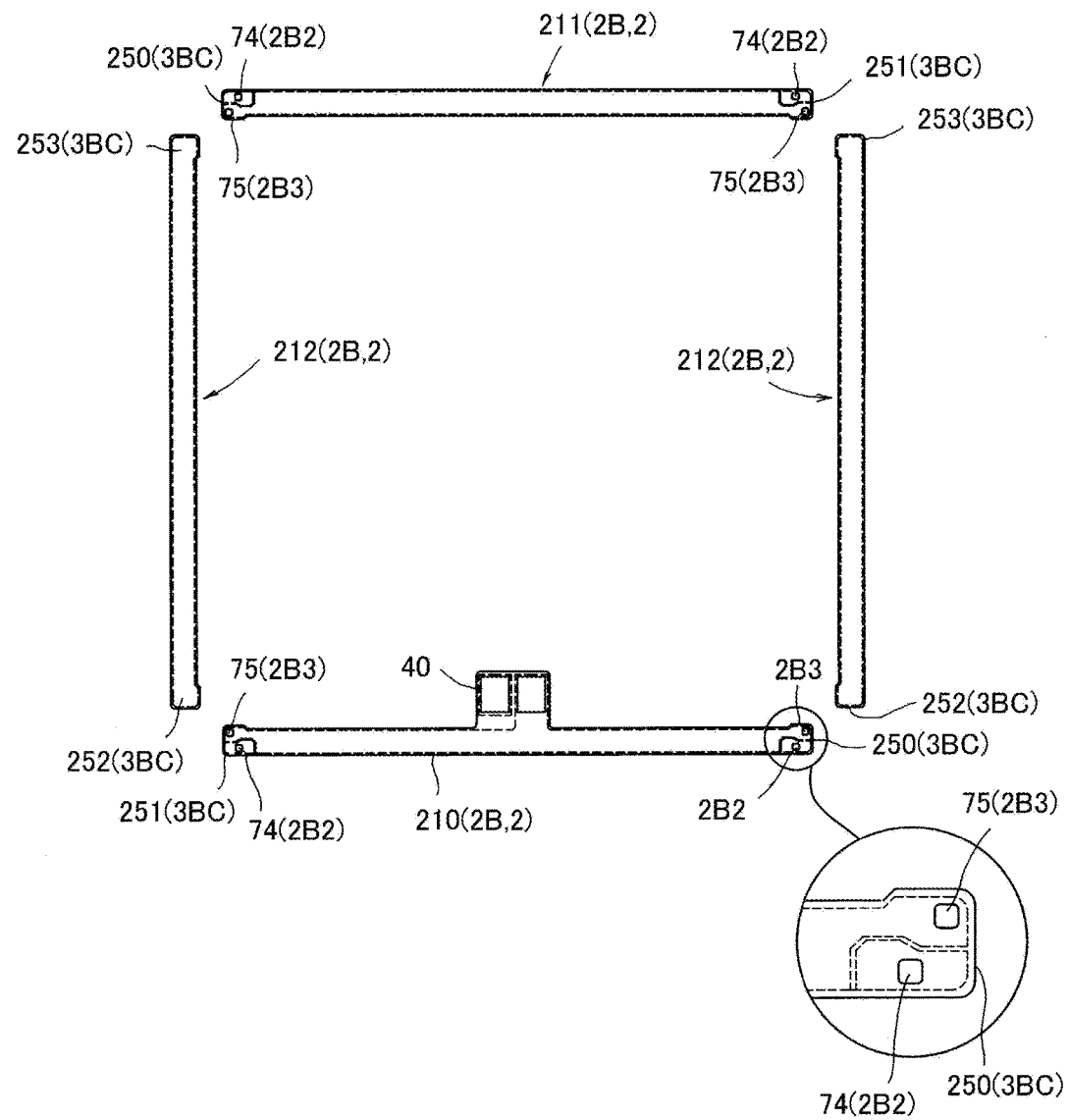
FIG. 16 is a plan view of the set of four pieces of FPCs shown in FIGS. 6A to 6C as seen from the back surface side.

Further, as shown in FIGS. 15 and 16, on the opposite ends in the extending direction of the first I-shaped FPC 210, FPC connecting-pad disposed parts 250, 251 are positioned, respectively.

As shown in FIG. 16, the FPC connecting-pad disposed parts 250, 251 are each provided with an anode-side conductive part 74 (corresponding to the FPC connecting pad 2B2 described above) and a cathode-side conductive part 75 (corresponding to the FPC connecting pad 2B3 described above), whereby the portions where the one-end both electrode connection sites 3BC are formed are formed.

The length in the width direction of the FPC connecting-pad disposed parts 250, 251 is greater than the length in the same direction of other portion excluding the portion where the power supplying terminal 40 is formed.

Note that, the width direction as used herein is the width direction of the first I-shaped FPC 210.

Here, as described above, the first I-shaped FPC 210 includes the anode-dedicated equipotential region 22 and the cathode-dedicated equipotential region 23. Both of them function as conductive lines, and are partially exposed outside.

Specifically, as shown in FIG. 15, on the press-bonded surface side of the first I-shaped FPC 210, the anode-dedicated equipotential region 22 is partially exposed whereby the anode-dedicated tile connecting pad 2B12 is formed, and the cathode-dedicated equipotential region 23 is partially exposed whereby the cathode-dedicated tile connecting pads 2B13 are formed. Further, as shown in FIG. 16, on the back surface side of the first I-shaped FPC 210, in each of the one-end both electrode connection sites 3BC, the anode-dedicated equipotential region 22 is partially exposed whereby the anode-side conductive part 74 is formed, and the cathode-dedicated equipotential region 23 is partially exposed whereby the cathode-side conductive part 75 is formed.

Note that, the press-bonded surface of the first I-shaped FPC 210 (the one-end both electrode connection FPC 2B) is also a contact surface which is brought into contact with the planar light emitting tile 10. A surface positioned on the side opposite to the contact surface is a back surface (the front surface). The press-bonded surface and the back surface (the contact surface and the front surface) are surfaces that are opposite to each other while being spaced apart from each other in the member thickness direction of the first I-shaped FPC 210.

As shown in FIG. 15, the anode-dedicated tile connecting pad 2B12 and the cathode-dedicated tile connecting pads 2B13 are each rectangular extending along the longitudinal direction of the first I-shaped FPC 210 as seen in a plan view. Note that, the length in the longitudinal direction of the anode-dedicated tile connecting pad 2B12 is greater than the length in the longitudinal direction of each cathode-dedicated tile connecting pad 2B13.

The anode-dedicated tile connecting pad 2B12 and the cathode-dedicated tile connecting pads 2B13 are disposed toward one end side (an end on the outer side when the planar light emitting device 100 is formed), in the width direction of the first I-shaped FPC 210. Note that, the position toward one end side refers to an upper position in the first I-shaped FPC 210 shown in FIG. 3.

Further, at the press-bonded surface of the first I-shaped FPC 210, along the longitudinal direction of the first I-shaped FPC 210, from one end toward other end, the first cathode-dedicated tile connecting pad 2B13, the anode-dedicated tile connecting pad 2B12, and the second cathode-dedicated tile connecting pad 2B13 are sequentially juxtaposed to each other while being spaced apart from each other.

Here, these anode-dedicated tile connecting pad 2B12 and the cathode-dedicated tile connecting pads 2B13 are disposed at different positions from the FPC connecting-pad disposed parts 250, 251. That is, on the press-bonded surface side of the two one-end both electrode connection sites 3BC, the anode-dedicated equipotential region 22 and the cathode-dedicated equipotential regions 23 are not exposed outside.

Further, as shown in FIGS. 6A to 6C and 16, in the back surface of the first I-shaped FPC 210, one anode-side conductive part 74 and one cathode-side conductive part 75 are formed at each of the FPC connecting-pad disposed parts 250, 251 at their respective back surfaces.

Specifically, as shown in FIGS. 6A to 6C and 16, in each of the back surfaces of the FPC connecting-pad disposed parts 250, 251, the anode-side conductive part 74 is formed at a portion spaced apart toward the central side from an end in the longitudinal direction of the first I-shaped FPC 210, the portion being on the outer side when the planar light emitting device 100 is formed. The cathode-side conductive part 75 is formed at a portion spaced apart toward an end in the longitudinal direction of the first I-shaped FPC 210 from the anode-side conductive part 74, the portion being on the inner side when the planar light emitting device 100 is formed.

The anode-side conductive part 74 and the cathode-side conductive part 75 are each rounded quadrangular as seen in a plan view.

Here, a further detailed description will be given of the anode-dedicated equipotential region 22 and the cathode-dedicated equipotential region 23 of the first I-shaped FPC 210.

Note that, the anode-dedicated equipotential region 22 and the cathode-dedicated equipotential region 23 are each a film-like or thin-plate like portion, and the member thickness direction thereof is identical to the member thickness direction of the first I-shaped FPC 210.

Figure 17:
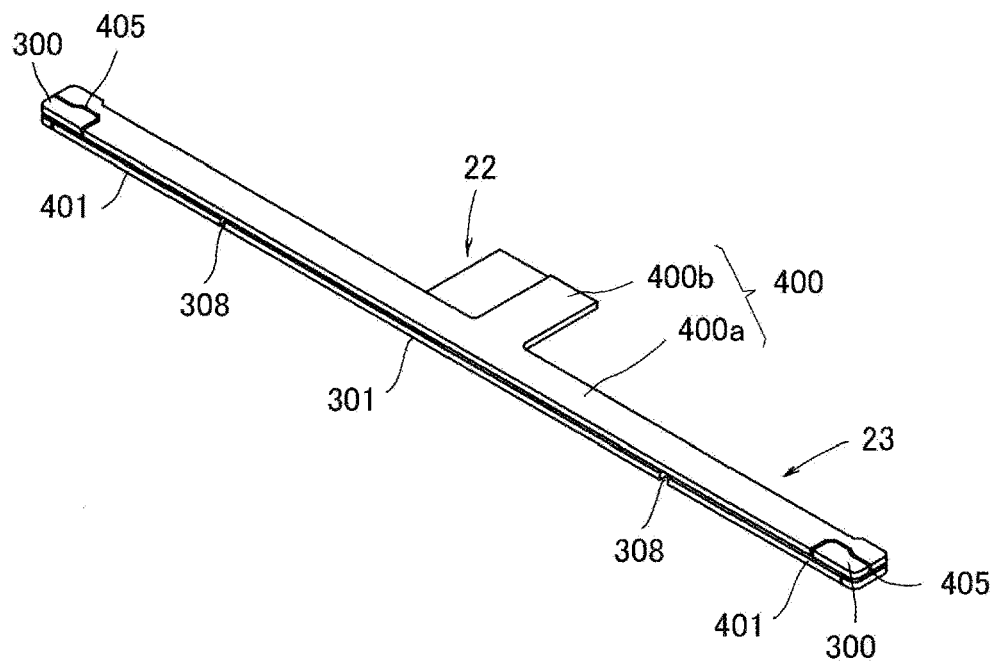
FIG. 17 is a perspective view schematically showing just an anode-dedicated equipotential region and a cathode-dedicated equipotential region of a first I-shaped FPC out of the set of four pieces of FPCs shown in FIGS. 6A to 6C.

As shown in FIGS. 16 and 17, the anode-dedicated equipotential region 22 includes two anode-dedicated pad forming plates 300 (the front-side anode regions) positioned on the back surface side (the upper side in FIG. 17), and a body plate 301 (the contact surface-side anode region) positioned on the press-bonded surface side (the lower side in FIG. 17). The two anode-dedicated pad forming plates 300 and the body plate 301 are electrically connected to each other through a through hole or the like so as to be equipotential.

As shown in FIGS. 16 and 17, the cathode-dedicated equipotential region 23 includes a cathode-dedicated coupling plate 400 (a front-side cathode region) positioned on the back surface side (the upper side in FIG. 17) and two cathode-dedicated pad forming plates 401 (contact surface-side cathode regions) positioned on the press-bonded surface side (the lower side in FIG. 17). The cathode-dedicated coupling plate 400 and the two cathode-dedicated pad forming plates 401 are electrically connected to each other through a through hole or the like so as to be equipotential.

As shown in FIG. 16, the anode-dedicated pad forming plates 300 are sites disposed at the FPC connecting-pad disposed parts 250, 251, and are each rectangular along the longitudinal direction of the first I-shaped FPC 210 as seen in a plan view. More specifically, the anode-dedicated pad forming plates 300 are sites disposed at cutout parts 405 of the cathode-dedicated coupling plate 400 which will be described later, and the length in the width direction of each portion is greater at a portion positioned on the central side in the longitudinal direction of the first I-shaped FPC 210 than other portion.

Note that, the width direction of the anode-dedicated pad forming plate 300 is identical to the width direction of the first I-shaped FPC 210.

Figure 18:
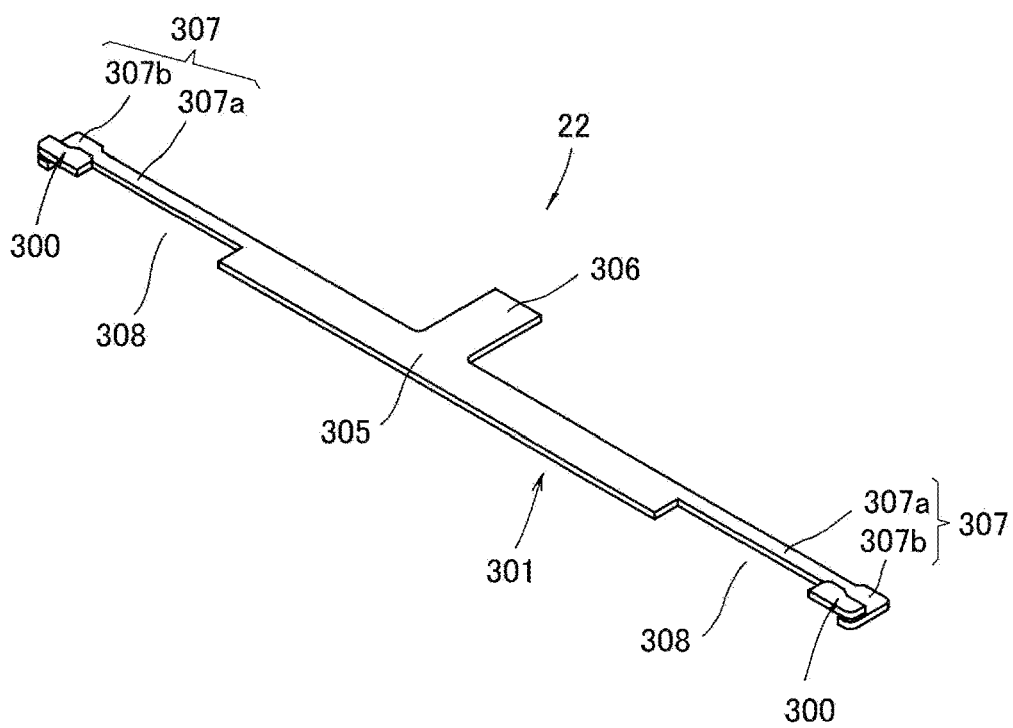
FIG. 18 is a perspective view schematically showing just the anode-dedicated equipotential region of the first I-shaped FPC shown in FIG. 17.

As shown in FIG. 18, the body plate 301 is formed by an anode-dedicated pad forming plate part 305, an anode-side terminal-dedicated plate part 306, and two extending plate parts 307 being integrated with one another.

The anode-dedicated pad forming plate part 305 is a portion disposed around the center in the longitudinal direction of the first I-shaped FPC 210, and is rectangular as seen in a plan view extending along the longitudinal direction of the first I-shaped FPC 210.

The anode-side terminal-dedicated plate part 306 is a portion that projects from the edge portion of the anode-dedicated pad forming plate part 305, and is rectangular extending in the projecting direction as seen in a plan view. Here, the anode-side terminal-dedicated plate part 306 projects further inward from an edge portion positioned on the inner side when the planar light emitting device 100 is formed (see FIGS. 6A to 6C and 16 and others), out of edge portions of the anode-dedicated pad forming plate part 305. That is, the longitudinal direction of the anode-side terminal-dedicated plate part 306 crosses (is perpendicular to) the longitudinal direction of the anode-dedicated pad forming plate part 305.

The extending plate parts 307 each include a long plate part 307a and an end side-plate part 307b.

The long plate parts 307a respectively project from ends in the longitudinal direction of the anode-dedicated pad forming plate part 305, and extend along the longitudinal direction of the first I-shaped FPC 210. That is, the long plate parts 307a respectively extend between the central side and near ends in the longitudinal direction of the first I-shaped FPC 210.

Each of the long plate parts 307a extends, in the first I-shaped FPC 210, on the inner side when the planar light emitting device 100 is formed. That is, the length in the width direction of each long plate part 307a is smaller than the length in the width direction of the anode-dedicated pad forming plate part 305, and each long plate part 307a is positioned, in the lateral side of the anode-dedicated pad forming plate part 305, on the lateral side positioned on the inner side when the planar light emitting device 100 is formed.

Each end side-plate part 307b is a portion that is continuous to a projecting end of the long plate part 307a, that is, to an end on the FPC connecting-pad disposed part 250 or 251 (on the one-end both electrode connection site 3BC side), and is rectangular as seen in a plan view. More specifically, the end side-plate part 307b as seen in a plan view is rectangular extending in the direction (the width direction) perpendicular to the extending direction of the long plate part 307a.

That is, the extending plate parts 307 are each a portion that extends to be L-shaped as seen in a plan view.

Here, at respective positions between the anode-dedicated pad forming plate part 305 and the end side-plate parts 307b and adjacent to the outer side (the outer side in the width direction) of the long plate parts 307a when the planar light emitting device 100 is formed, cutout parts 308 each having its three sides surrounded by the anode-dedicated pad forming plate part 305, the long plate part 307a, and the end side-plate part 307b are formed.

That is, in the body plate 301, a portion excluding the anode-side terminal-dedicated plate part 306 is a film-like or thin-plate like portion which is similar in shape to the first I-shaped FPC 210 as seen in a plan view, except that the two cutout parts 308 are formed.

The two cutout parts 308 are respectively formed at positions spaced apart from each other in the longitudinal direction of the first I-shaped FPC 210, and are rectangular extending in the longitudinal direction of the first I-shaped FPC 210 as seen in a plan view.

Further, at positions spaced apart toward the back surface side from part of the end side-plate parts 307b (the positions spaced apart toward the upper side in FIG. 17), part of the anode-dedicated pad forming plates 300 is positioned. That is, part of the end side-plate parts 307b and part of the anode-dedicated pad forming plates 300 are positioned so as to overlap with each other while being spaced apart from each other in the member thickness direction of the first I-shaped FPC 210.

The cathode-dedicated coupling plate 400 is formed by the long plate part 400a and the cathode-side terminal-dedicated plate part 400b being integrated with each other.

The long plate part 400a extends along the longitudinal direction of the first I-shaped FPC 210, and is a film-like or thin-plate like portion which is similar in shape to the first I-shaped FPC 210 as seen in a plan view, except that two cutout parts 405 are formed.

Each of the cutout parts 405 as seen in a plan view is a space having a shape similar to the anode-dedicated pad forming plate 300 as seen in a plan view. That is, the shape of each cutout part 405 as seen in a plan view is a partially widened rectangular shape extending in the longitudinal direction of the anode-dedicated pad forming plate 300.

The cathode-side terminal-dedicated plate part 400b is an edge portion of the long plate part 400a, and projects further inward from an edge portion which is positioned on the inner side when the planar light emitting device 100 is formed. The cathode-side terminal-dedicated plate part 400b is rectangular extending in the projecting direction as seen in a plan view. In other words, the cathode-side terminal-dedicated plate part 400b is rectangular extending in a direction perpendicular to the longitudinal direction of the first I-shaped FPC 210.

The cathode-dedicated pad forming plates 401 are each rectangular extending in the longitudinal direction of the first I-shaped FPC 210 as seen in a plan view. The two cathode-dedicated pad forming plates 401 are respectively disposed at different cutout parts 308.

Accordingly, on the press-bonded surface side of the first I-shaped FPC 210, from one end toward other end in the longitudinal direction, the first cathode-dedicated pad forming plate 401, part of the anode-dedicated pad forming plate part 305, and the second cathode-dedicated pad forming plate 401 are juxtaposed to each other while being spaced apart from each other.

The second I-shaped FPC 211 is similarly structured as the first I-shaped FPC 210, except that the power supplying terminal 40 is not formed. Further, the structure of inner parts, namely, the anode-dedicated equipotential region 22 and the cathode-dedicated equipotential region 23 are also similarly structured, except that the anode-side terminal-dedicated plate part 306 is not formed at the anode-dedicated equipotential region 22 and the cathode-side terminal-dedicated plate part 400b is not formed at the cathode-dedicated equipotential region 23. Therefore, a repetitive detailed description thereof is omitted.

Each third I-shaped FPC 212 also extends linearly so as to be I-shaped as seen in a plan view, and at opposite ends in the extending direction, FPC connecting-pad disposed parts 252, 253 (the one-end both electrode connection sites 3BC) are respectively formed. The length in the width direction of the FPC connecting-pad disposed parts 252, 253 is greater than the length in the same direction of other continuous portions. Note that, the width direction as used herein is the width direction of the third I-shaped FPCs 212.

Each third I-shaped FPC 212 also includes therein the anode-dedicated equipotential region 22 and the cathode-dedicated equipotential region 23. Both of them function as conductive lines, and are partially exposed outside.

Specifically, as shown in FIG. 15, on the press-bonded surface side of the FPC connecting-pad disposed parts 252, 253, the anode-dedicated equipotential region 22 is partially exposed whereby the anode-dedicated tile connecting pad 2B12 is formed, and the cathode-dedicated equipotential region 23 is partially exposed whereby the cathode-dedicated tile connecting pads 2B13 are formed. Further, on the press-bonded surface side of each third I-shaped FPC 212, at each of the press-bonded surface of the FPC connecting-pad disposed parts 252, 253, the anode-dedicated equipotential region 22 is partially exposed whereby an anode-side conductive part 76 (the anode-dedicated FPC connecting pad 2B2) is formed, and the cathode-dedicated equipotential region 23 is partially exposed whereby a cathode-side conductive part 77 (the cathode-dedicated FPC connecting pad 2B3) is formed.

That is, while the anode-side conductive parts 74 and the cathode-side conductive parts 75 are formed just on the back surface side in the first I-shaped FPC 210, the anode-side conductive parts 76 and the cathode-side conductive parts 77 are formed just on the press-bonded surface side in each third I-shaped FPC 212. That is, on the back surface side of each third I-shaped FPC 212, none of the anode-dedicated equipotential region 22 and the cathode-dedicated equipotential region 23 are exposed outside.

The shape and disposed position of the anode-dedicated tile connecting pad 2B12 and the cathode-dedicated tile connecting pads 2B13 formed at each third I-shaped FPC 212 are similar to those of the first I-shaped FPC 210 and, therefore, a repetitive description thereof is omitted.

Here, as shown in FIGS. 6A to 6C and 15, in the press-bonded surface of each third I-shaped FPC 212, one anode-side conductive part 76 and one cathode-side conductive part 77 are formed on the press-bonded surface at each of the FPC connecting-pad disposed parts 252, 253. That is, at each of two one-end both electrode connection sites 3BC, a pair of connecting pads being the anode-dedicated FPC connecting pad 2B2 (the anode-side conductive part 76) and the cathode-dedicated FPC connecting pad 2B3 (the cathode-side conductive part 77) is formed.

Specifically, as shown in FIGS. 6A to 6C and 15, in each of the press-bonded surfaces of the FPC connecting-pad disposed parts 252, 253, at a position spaced apart toward the central side from an end in the longitudinal direction of the third I-shaped FPC 212, the position being on the inner side when the planar light emitting device 100 is formed, the cathode-side conductive part 77 is formed. At a position spaced apart toward an end in the longitudinal direction of the third I-shaped FPC 212 from the cathode-side conductive part 77, the position being on the outer side when the planar light emitting device 100 is formed, the anode-side conductive part 76 is formed.

The anode-side conductive part 76 and the cathode-side conductive part 77 are also rounded quadrangular as seen in a plan view.

Here, a further detailed description will be given of the anode-dedicated equipotential region 22 and the cathode-dedicated equipotential region 23 of the third I-shaped FPC 212.

Note that, the anode-dedicated equipotential region 22 and the cathode-dedicated equipotential region 23 are each a film-like or thin-plate like portion, and the member thickness direction thereof is identical to the member thickness direction of the third I-shaped FPC 212.

Figure 19:
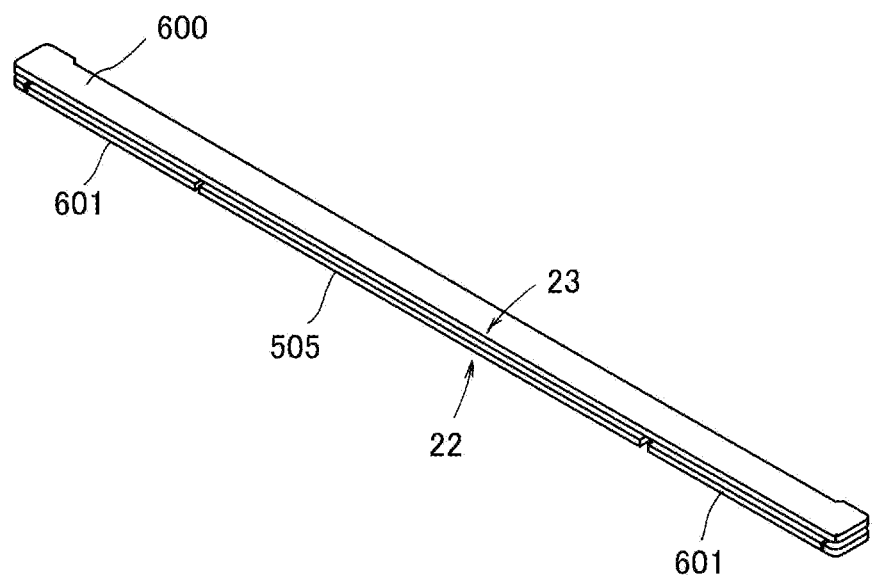
FIG. 19 is a perspective view schematically showing just an anode-dedicated equipotential region and a cathode-dedicated equipotential region of a third I-shaped FPC out of the set of four pieces of FPCs shown in FIGS. 6A to 6C.
Figure 20:
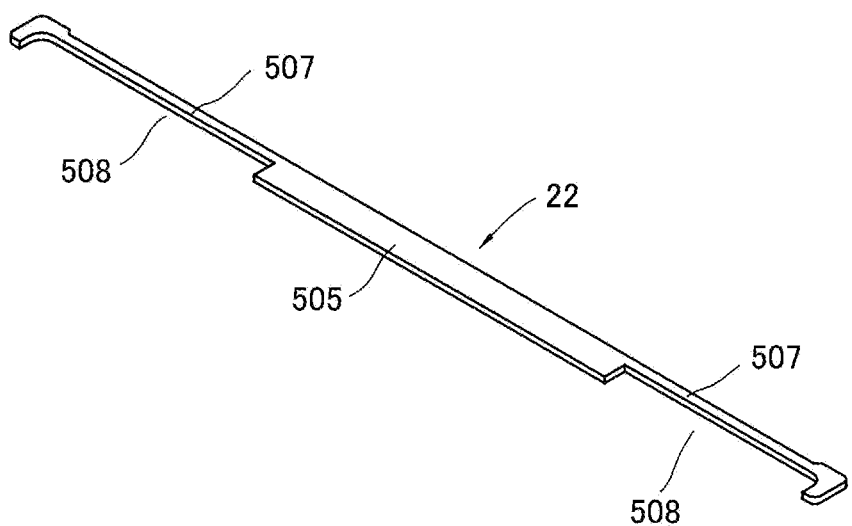
FIG. 20 is a perspective view schematically showing just the anode-dedicated equipotential region of the third I-shaped FPC shown in FIG. 19.

As shown in FIGS. 19 and 20, the anode-dedicated equipotential region 22 is one film-like or thin-plate like member positioned on the press-bonded surface side (the lower side in FIG. 19). In the third I-shaped FPC 212, the entire anode-dedicated equipotential region 22 is the contact surface-side anode region.

As shown in FIGS. 19 and 20, the cathode-dedicated equipotential region 23 includes a cathode-dedicated coupling plate 600 (a front-side cathode region) positioned on the back surface side (the upper side in FIG. 19), and two cathode-dedicated pad forming plates 601 (contact surface-side cathode regions) positioned on the press-bonded surface side (the lower side in FIG. 19). The cathode-dedicated coupling plate 600 and the two cathode-dedicated pad forming plates 601 are electrically connected to each other through a through hole or the like so as to be equipotential.

As shown in FIG. 19, the anode-dedicated equipotential region 22 is formed by an anode-dedicated pad forming plate part 505 and two extending plate parts 507 being integrated with one another.

Here, as shown in FIG. 20, the anode-dedicated pad forming plate part 505 is substantially identical in shape to the anode-dedicated pad forming plate part 305 of the first I-shaped FPC 210 (see FIG. 18). Each of the extending plate part 507 is also substantially identical in shape to the extending plate part 307 of the first I-shaped FPC 210.

That is, the anode-dedicated equipotential region 22 is substantially identical in shape to the body plate 301 in the anode-dedicated equipotential region 22 of the first I-shaped FPC 210. In other words, the anode-dedicated pad forming plate part 505 is also a film-like or thin-plate like portion which is similar in shape to the third I-shaped FPC 212 as seen in a plan view, except that two cutout parts 508 are formed.

Accordingly, these two cutout parts 508 are also provided so as to be spaced apart from each other in the longitudinal direction of the third I-shaped FPC 212, and each cutout part 508 as seen in a plan view is rectangular extending in the longitudinal direction of the third I-shaped FPC 212.

The cathode-dedicated coupling plate 600 is a long plate-like portion extending along the longitudinal direction of the third I-shaped FPC 212, whose shape as seen in a plan view is similar to the shape of the third I-shaped FPC 212 as seen in a plan view.

Each of the cathode-dedicated pad forming plate 601 as seen in a plan view is rectangular extending in the longitudinal direction of the third I-shaped FPC 212. The two cathode-dedicated pad forming plates 601 are respectively disposed at separate cutout parts 508.

Accordingly, on the press-bonded surface side of the third I-shaped FPC 212 also, from one end toward other end in the longitudinal direction, the first cathode-dedicated pad forming plate 601, part of the anode-dedicated pad forming plate part 505, and the second cathode-dedicated pad forming plate 601 are juxtaposed to each other while being spaced apart from each other.

Figure 21:
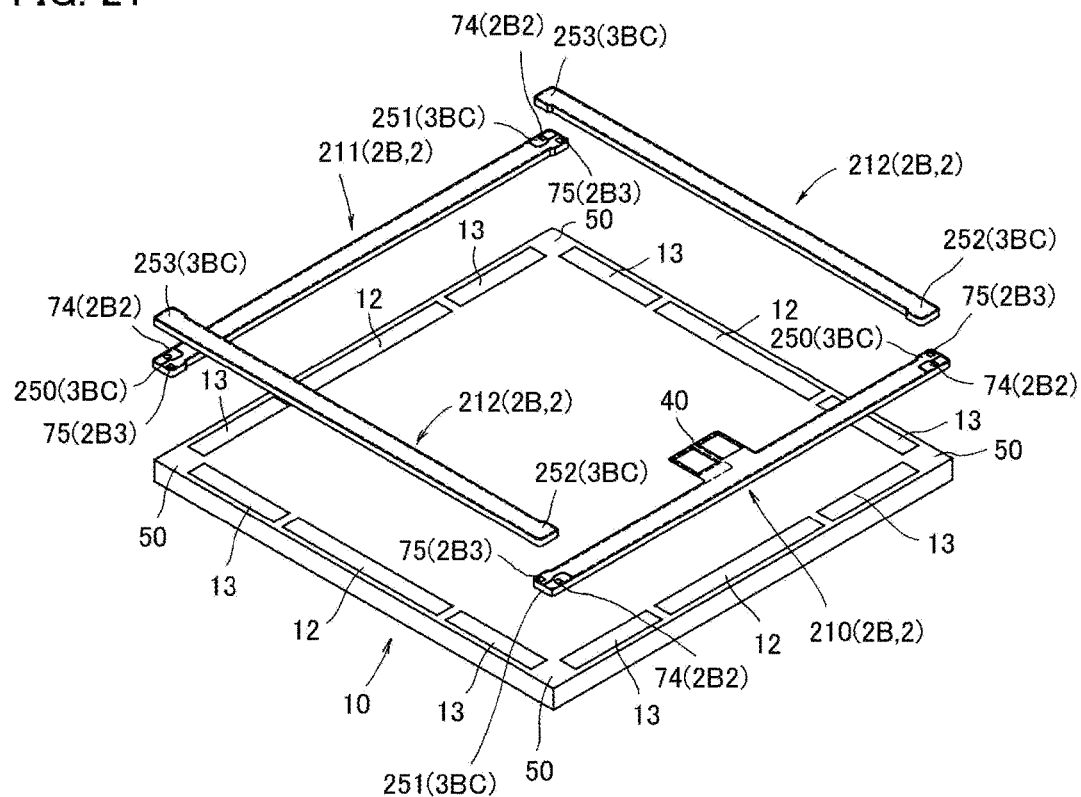
FIG. 21 is an explanatory diagram showing a manner of forming a planar light emitting device employing the set of four pieces of FPCs shown in FIGS. 6A to 6C, showing the state before the FPCs are mounted.
Figure 22:
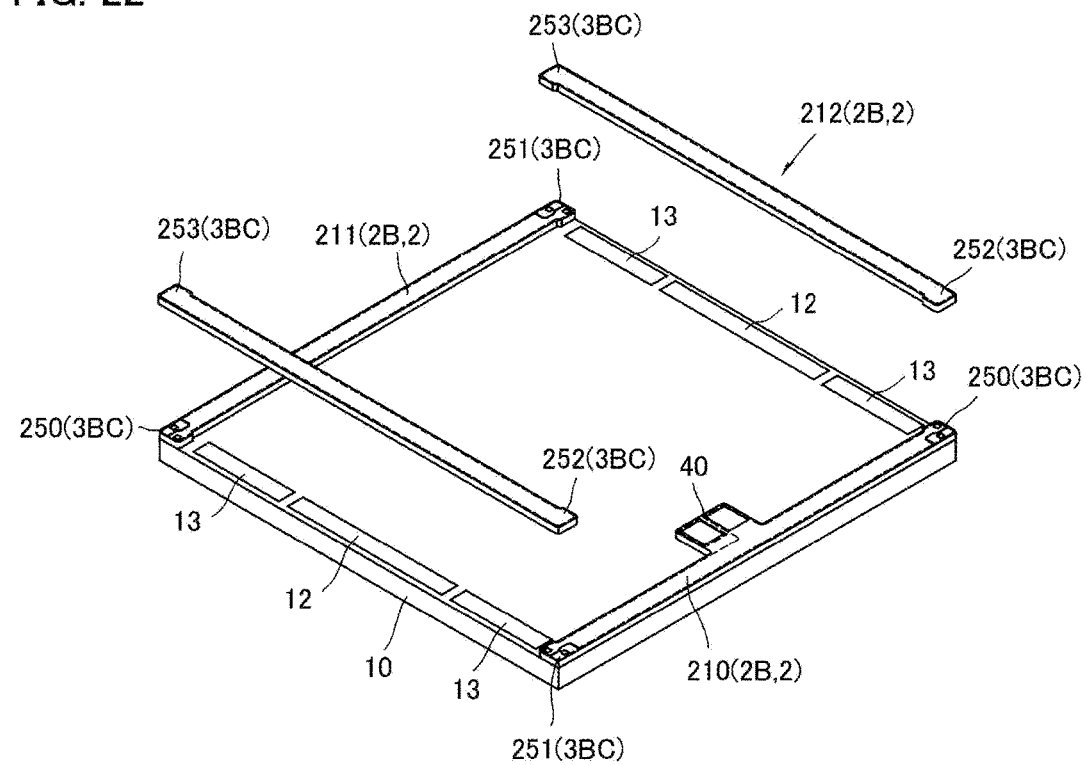
FIG. 22 is an explanatory diagram showing the manner of forming a planar light emitting device employing the set of four pieces of FPCs subsequently to FIG. 21, showing the state where two FPCs are mounted on the back surface of a planar light emitting tile.
Figure 23:
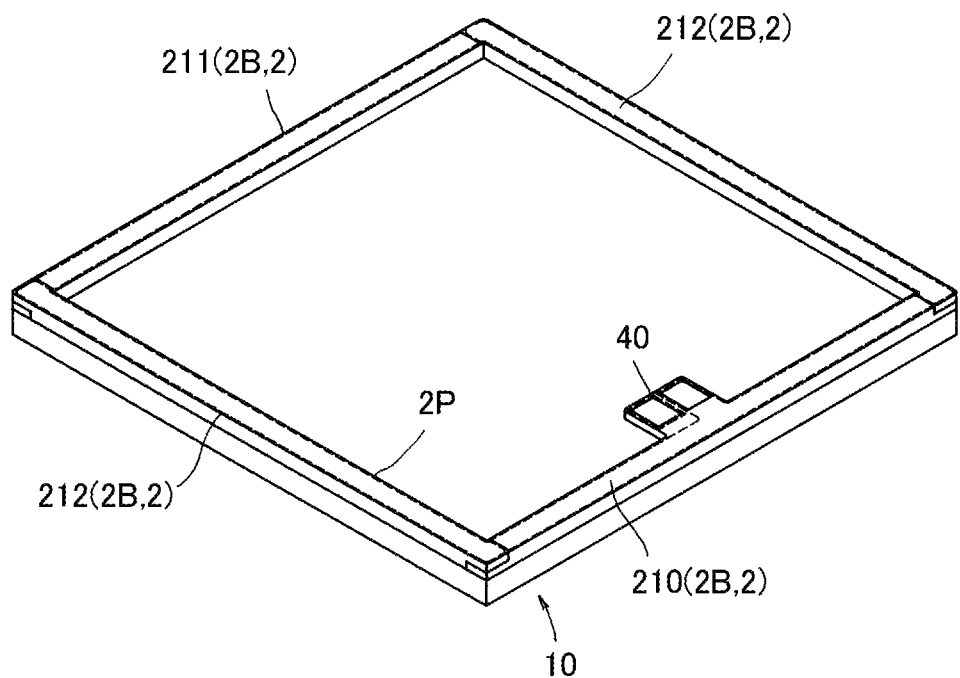
FIG. 23 is an explanatory diagram showing the manner of forming a planar light emitting device employing the set of four pieces of FPCs subsequently to FIG. 22, showing the state where all the FPCs are mounted.

As shown in FIGS. 21 and 23, the two one-end both electrode connection FPCs 2B (the first I-shaped FPC 210 and the second I-shaped FPC 211) are integrally mounted on the back surface of the planar light emitting tile 10, and other two one-end both electrode connection FPCs 2B (the two third I-shaped FPCs 212) are further mounted thereon. Thus, the planar light emitting device 100 is manufactured.

Firstly, the two FPC connecting-pad disposed parts 250, 251 formed on each of the first I-shaped FPC 210 and the second I-shaped FPC 211 are respectively mounted on and directly in contact with separate connecting-part disposed regions 50. That is, four FPC connecting-pad disposed parts 250, 251 are respectively mounted on separate connecting-part disposed regions 50.

More specifically, on two connecting-part disposed regions 50 positioned near one of two parallel sides out of the four sides of the planar light emitting tile 10, two FPC connecting-pad disposed parts 250, 251 of the first I-shaped FPC 210 are mounted. On other two connecting-part disposed regions 50 positioned near other one of the two parallel sides, two FPC connecting-pad disposed parts 250, 251 of the second I-shaped FPC 211 are mounted.

Thus, the first I-shaped FPC 210 and the second I-shaped FPC 211 are disposed so that their respective longitudinal directions are identical to the longitudinal directions of the two parallel sides.

In this manner, by the first I-shaped FPC 210 and the second I-shaped FPC 211 being mounted, the anode-dedicated tile connecting pads 3B12 and the cathode-dedicated tile connecting pads 3B13 disposed on the press-bonded surface side of respective one-end both electrode connection FPCs 2B (see FIG. 3 and others) are brought into contact with the anode pads 12 and the cathode pads 13 formed on the planar light emitting tile 10.

Next, to the structure formed by the first I-shaped FPC 210 and the second I-shaped FPC 211 being mounted on the back surface of the planar light emitting tile 10, two third I-shaped FPCs 212 are brought closer externally to the side which would be the back surface when the planar light emitting device 100 is formed, and mounted on the structure.

Specifically, one FPC connecting-pad disposed part 252 in one third I-shaped FPC 212 is mounted on one FPC connecting-pad disposed part 250 of the first I-shaped FPC 210. Then, other FPC connecting-pad disposed part 253 is mounted on the one FPC connecting-pad disposed part 251 of the second I-shaped FPC 211.

Thus, one third I-shaped FPC 212 is disposed above a peripheral part β in the back surface of the planar light emitting tile 10 so as to linearly extend between opposite ends of the two one-end both electrode connection FPCs 2B (the first I-shaped FPC 210 and the second I-shaped FPC 211).

Similarly, one FPC connecting-pad disposed part 252 in the other third I-shaped FPC 212 is mounted on other FPC connecting-pad disposed part 251 of the first I-shaped FPC 210. Then, the other FPC connecting-pad disposed part 253 is mounted on other FPC connecting-pad disposed part 250 of the first I-shaped FPC 210.

Thus, the other third I-shaped FPC 212 is also disposed above the peripheral part β in the back surface of the planar light emitting tile 10 so as to linearly extend between opposite ends of the two one-end both electrode connection FPCs 2B (the first I-shaped FPC 210 and the second I-shaped FPC 211).

Thus, at each of the four connecting-part disposed regions 50, separate one-end both electrode connection sites 3BC (the FPC connecting pad-disposed parts 250, 251) are directly mounted, and further thereon, separate one-end both electrode connection sites 3BC (the FPC connecting-pad disposed parts 252, 253) are mounted.

Here, the anode-dedicated FPC connecting pads 2B2 are brought into contact with each other and the cathode-dedicated FPC connecting pads 2B3 are brought into contact with each other in the two one-end both electrode connection sites 3BC overlapping with each other.

That is, as has been described above, in each one-end both electrode connection site 3BC directly mounted on the planar light emitting tile 10, the anode-side conductive part 74 and the cathode-side conductive part 75 are formed on its back surface side. On the other hand, as has been described above, in each one-end both electrode connection site 3BC mounted thereon, the anode-side conductive part 76 and the cathode-side conductive part 77 are formed on its press-bonded surface side.

Thus, when the two one-end both electrode connection sites 3BC are disposed so as to overlap with each other, the anode-side conductive parts 74, 76 are brought into contact with each other and the cathode-side conductive parts 75, 77 are brought into contact with each other, whereby two electrical connection sites 32, 33 are formed. That is, at each of the positions respectively overlapping with the four connecting-part disposed regions 50, two electrical connection sites 32, 33 are formed.

Then, the anode-dedicated tile connecting pads 3B12 (see FIG. 3 and others) and the cathode-dedicated tile connecting pads 3B13 disposed on the press-bonded surface side of the two third I-shaped FPCs 212 are brought into contact with the anode pads 12 and the cathode pads 13 formed at the planar light emitting tile 10.

Thus, the four one-end both electrode connection FPCs 2B are integrated to form the square-annular shaped FPC 2P. That is, the four FPCs 2 each having portions being brought into contact with the anode pads 12 and the cathode pads 13 of the planar light emitting tile 10 are coupled to each other, whereby a square-annular shaped FPC 2P is formed.

EXAMPLE

In the following, a description will be given about forming an organic EL panel as a specific example of the present invention.

Example

As an example of the planar light emitting device 100, an organic EL panel was fabricated.

Firstly, as a light-transmissive anode film, an ITO-mounted glass substrate (the insulating substrate 11) that has a thickness of 0.7 mm and that is mounted with a film of ITO being a transparent conductive metal oxide layer was provided. The outer dimension of the ITO-mounted glass substrate was 90 mm×90 mm.

Next, ITO of the ITO-mounted glass substrate was exposed to wet etching for patterning the anode pads 12 and the cathode pads 13 shown in FIG. 2, thus preparing an organic EL element-formation substrate. That is, near each of the four sides of the ITO-mounted glass substrate, a cathode pad having a length of 15.1 mm, an insulating region having a length of 1 mm, an anode pad having a length of 48 mm, an insulating region having a length of 1 mm, and a cathode pad having a length of 15.1 mm were formed. That is, the pads were formed so that, around each of the sides, the first cathode pad, the anode pad, and the second cathode pad were juxtaposed to each other while being spaced apart from each other, from one end of the near side toward the other end side in the longitudinal direction. Further, the space between the pads was an insulating region.

Next, on the organic EL element-formation substrate, organic functional films such as a hole injection layer, a hole transport layer, a light emitting layer, an electron transport layer, and an electron injection layer were sequentially layered, and a metal cathode layer made of aluminum was layered as a reflective cathode layer, whereby an organic EL element (the planar light emitting element 1) was formed. At this time, the organic EL element was formed so that a light emitting region of 80 mm×80 mm was obtained.

Thereafter, a silicon nitride film was formed by CVD. A sealing film was formed by spraying polysilazane and firing the same. A protective film made of an adhesive-equipped PET was bonded. Thus, an organic EL tile (the planar light emitting tile 10) was fabricated.

Next, FPCs corresponding to a set of two pieces of L-shaped FPCs shown in FIG. 3 were provided. Then, one FPC was bonded by thermocompression using an anisotropic conductive film (ACF) to the organic EL tile.

Further, other FPC, which is a reversely L-shaped FPC in which organic EL tile-dedicated connecting pads and wiring member connecting pads were formed, was bonded by thermocompression. That is, using an anisotropic conductive film (ACF), the FPC was bonded by thermocompression to the anode pads 12 and the cathode pads 13 of the organic EL tile. The thermocompression bonding was performed at a temperature of 180° C. and for a time of 20 sec.

Note that, the organic EL tile-dedicated connecting pads correspond to the above-described anode-dedicated tile connecting pads 2A12 and cathode-dedicated tile connecting pads 2A13, and the wiring member connecting pads correspond to the FPC connecting pads 2A2, 2A3.

Next, the overlapping portions of the FPCs corresponding to the FPC overlapping portions shown in FIG. 5 are bonded to each other using a conductive adhesive agent, whereby the organic EL panel (the planar light emitting device) was completed.

As in this Example, when a square-annular shaped FPC serving as a power supply terminal is formed using two L-shaped FPCs, the utilization efficiency of the base member of the FPCs has been improved by 2.9 times as great as that in the conventional case where a power supply terminal is formed with a square-annular shaped FPC itself Specifically, conventionally in general, electrode pads for a planar light emitting device are disposed in the following manner: in a square panel, anode pads are disposed at the four sides, and cathode pads are disposed at four corners. By these anode and cathode pads supplying current in four directions evenly to the organic EL light emitting element, occurrence of unevenness in in-plane luminance is suppressed. Here, the conventional FPC has a square-annular shape corresponding to the arrangement of the electrode pads in the panel. Accordingly, the sheet material on the inner side of the square-annular shape is wasted, inviting a reduction in the material utilization efficiency and an increase in costs.

Figure 24:
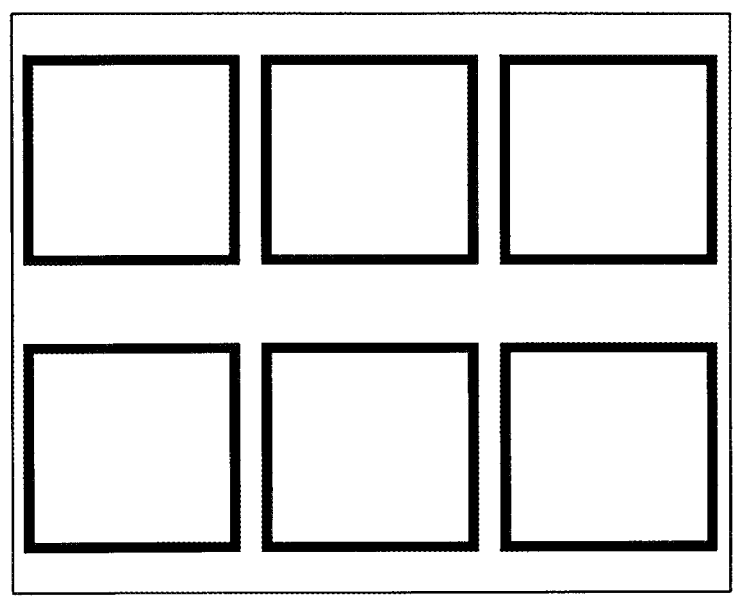
FIG. 24 is an explanatory diagram explaining the ratio between the usable portion and the waste portion when a conventional square-annular shaped FPC is obtained by punching a base member sheet, wherein the usable portion is shown with bold lines.

That is, in fabricating an FPC, a portion being identical in shape to the intended FPC must be obtained by punching or the like from a sheet-like base member being a raw material. Here, in the case where one portion corresponding to the square-annular shaped portion is extracted as in the conventional manner (see FIG. 24), a quadrangular portion positioned in the inner side of the extracted portion is wasted. Accordingly, provided that the portion corresponding to the square-annular shaped portion and other portion corresponding to other square-annular shaped portion are extracted from positions close to each other, a relatively great amount of waste portions are produced.

Figure 25:
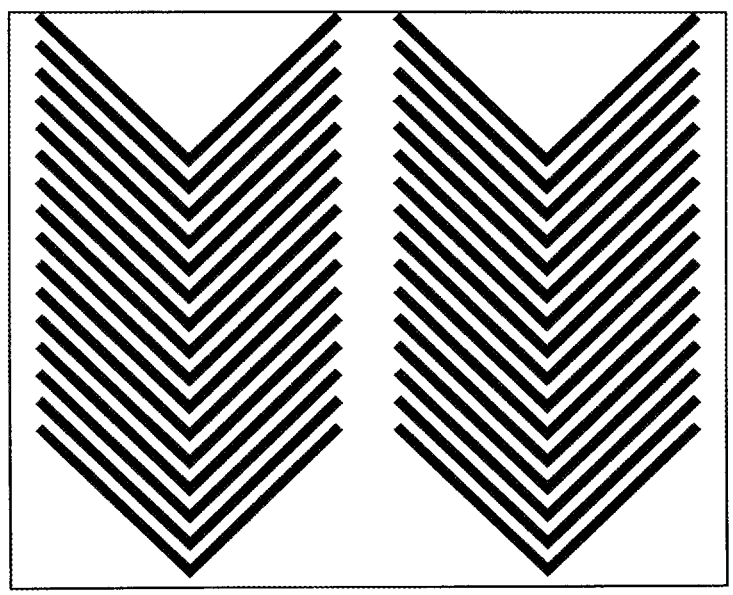
FIG. 25 is an explanatory diagram explaining the ratio between the usable portion and the waste portion when the set of two pieces of FPCs shown in FIG. 3 is obtained by punching a base member sheet, wherein the usable portion is shown with bold lines.

In contrast, when a portion having an L-shape is extracted as in Example (see FIG. 25), a greater number of elements can be obtained from a sheet-like base member of the same size. Thus, the utilization efficiency of the base member has been improved. Note that, in the case where an I-shaped portion corresponding to the one-end both electrode connection FPC 2B is extracted, the utilization efficiency of the base member further improves.

Further, in the Example, while the description has been made of the planar light emitting tile being quadrangular as seen in a plan view, the present invention can further improve the utilization efficiency of the FPC with a star-shaped or circular planar light emitting tile (panel). Considering that smaller elements are selectable as original plates of FPCs with a huge planar light emitting tile, the scheme of the embodiment and Example is extremely useful.

That is, in the present scheme, a plurality of power supplying FPCs are employed for one panel, and the conductive layers of adjacent FPCs are disposed so as to overlap with each other and electrically connected with each other. In this manner, an FPC that is continuous in an annular manner so as to form a star-shaped polygonal shape as seen in a plan view, or an FPC that is continuous in a circularly annular manner can be formed by a plurality of FPCs being integrated with one another. In more detail, a plurality of FPCs that linearly extend so as to be I-shaped, FPCs that partially bent and extend so as to be L-shaped, and FPCs that are at least partially curved and extend are formed in a plurality of numbers, and an FPC that is continuous in an annular manner is formed by combining such FPCs.

This scheme provides high material utilization efficiency of the FPCs, and easier FPC wiring to the electrode pads on the substrate. In this scheme, preferably connection between conductive layers of the FPCs is performed at ends of the FPCs, and one of anode and cathode is connected at one of the ends. This structure surely prevents short-circuiting in wiring during assembly. As to a quadrangular panel, a combination of two L-shaped FPCs is preferable.

LIST OF REFERENCE CHARACTERS

100: planar light emitting device (organic EL panel, LED panel)
10: planar light emitting tile (organic EL tile, LED tile)
1: planar light emitting element (organic EL element, LED tile)
11: insulating substrate
12: anode pad
13: cathode pad
2: FPC (circuit board)
2A: each-end single electrode connection FPC
2A12: anode-dedicated tile connecting pad
2A13: cathode-dedicated tile connecting pad
2A2: one FPC connecting pad (anode-dedicated)
2A3: other FPC connecting pad (cathode-dedicated)
2B: one-end both electrode connection FPC (I-shaped circuit board)
2B12: anode-dedicated tile connecting pad
2B13: cathode-dedicated tile connecting pad
2B2: anode-dedicated FPC connecting pad
2B3: cathode-dedicated FPC connecting pad
2O, 2P: square-annular shaped FPC (annular circuit board)
22: anode-dedicated equipotential region
23: cathode-dedicated equipotential region
32: FPC-FPC connecting site (electrically connecting site, anode side)
33: FPC-FPC connecting site (electrically connecting site, cathode side)
3BC: one-end both electrode connection site (I-shaped circuit board)
40: power supplying terminal
50: connecting-part disposed region
153, 154, 155, 156, 250, 251, 252, 253: FPC connecting-pad disposed part
70, 72, 74, 76: anode-side conductive part
71, 72, 75, 77: cathode-side conductive part
150: first L-shaped circuit board
151: second L-shaped circuit board
150a, 151a: body one-side part
150b, 151b: body other-side part
150c, 151c: curved continuous part
160: anode-dedicated coupling plate (front-side anode region)
161: anode-dedicated pad forming plate (contact surface-side anode region)
170: cathode-dedicated coupling plate (front-side cathode region)
171: cathode-dedicated pad forming plate (contact surface-side cathode region)
180 first anode-dedicated coupling plate (front-side anode region)
181: second anode-dedicated coupling plate (front-side anode region)
190: cathode-dedicated coupling plate (front-side cathode region)
183: first anode-dedicated pad forming plate (contact surface-side anode region)
184: second anode-dedicated pad forming plate (contact surface-side anode region)
185: third anode-dedicated pad forming plate (contact surface-side anode region)
192: first cathode-dedicated pad forming plate (contact surface-side cathode region)
193: second cathode-dedicated pad forming plate (contact surface-side cathode region)
194: third cathode-dedicated pad forming plate (contact surface-side cathode region)
195: fourth cathode-dedicated pad forming plate (contact surface-side cathode region)
300: anode-dedicated pad forming plate (front-side anode region)
301: body plate (contact surface-side anode region)
400: cathode-dedicated coupling plate (front-side cathode region)
401: cathode-dedicated pad forming plate (contact surface-side cathode region)
600: cathode-dedicated coupling plate (front-side cathode region)
601: cathode-dedicated pad forming plate (contact surface-side cathode region)
α: light emitting region corresponding part
β: peripheral part

The invention claimed is:
1. A planar light emitting device comprising:
a planar light emitting tile comprising:
a light emitting surface having a light emitting region;
a back surface, both of the light emitting surface and the back surface constituting main surfaces; and
a planar light emitting element on the light emitting surface; and
a plurality of circuit boards on the back surface,
wherein the planar light emitting element comprises:
an anode; and a cathode,
the planar light emitting element emitting light upon application of voltage between the anode and the cathode,
wherein the planar light emitting tile further comprises:
an anode pad conducted to the anode of the planar light emitting element to be equipotential;
a cathode pad conducted to the cathode of the planar light emitting element to be equipotential;
a region where the anode pad is disposed;
a region where the cathode pad is disposed; and
a first non-pad region and a second non-pad region where none of the anode pad and the cathode pad are disposed,
wherein each of the plurality of circuit boards is a flexible printed circuit and comprises:
an anode-dedicated equipotential region; and
a cathode-dedicated equipotential region, wherein the plurality of circuit boards comprise:
a first L-shaped circuit board;
a second L-shaped circuit board adjacent to the first L-shaped circuit board; and
an overlapped region,
wherein part of the first L-shaped circuit board and part of the second L-shaped circuit board overlap with each other on the back surface, to be the overlapped region where the part of the second L-shaped circuit board is positioned between the part of the first L-shaped circuit board and the back surface,
wherein the overlapped region comprises at least one of an anode-side electrical connection site where the anode-dedicated equipotential region of the first L-shaped circuit board and the anode-dedicated equipotential region of the second L-shaped circuit board are electrically connected to each other, and a cathode-side electrical connection site where the cathode-dedicated equipotential region of the first L-shaped circuit board and the cathode-dedicated equipotential region of the second L-shaped circuit board are electrically connected to each other,
wherein the first non-pad region and the second non-pad region are a first connecting-part disposed region and a second connecting-part disposed region that overlap with the anode-side electrical connection site and the cathode-side electrical connection site, respectively, or overlap with the cathode-side electrical connection site and the anode-side electrical connection site, respectively,
wherein each of the L-shaped circuit boards comprises:
a body one-side part that linearly extends in a predetermined direction;
a body other-side part that linearly extends in a direction crossing the predetermined direction; and
a curved continuous part positioned between the body one-side part and the body other-side part,
the body one-side part and the body other-side part being continuous to each other,
the L-shaped circuit board having a shape of being partially bent and extending as seen in a plan view,
wherein a first flexible printed circuit (FPC) connecting-pad disposed part is provided at an end part of the body one-side part and a second FPC connecting-pad disposed part is provided at an end part of a body other-end part in an extending direction,
wherein the first FPC connecting-pad disposed part and the second FPC connecting-pad disposed part constitute part of the overlapped region, the first FPC connecting-pad disposed part comprising just one of an anode-side conductive part that forms part of the anode-side electrical connection site and a cathode-side conductive part that forms part of the cathode-side electrical connection site, and the second FPC connecting-pad disposed part comprising just the other of the anode-side conductive part and the cathode-side conductive part,
wherein the back surface of the planar light emitting tile consists of: a light emitting region corresponding part that overlaps with the light emitting region as seen in the plan view; and a peripheral part, the back surface being quadrangular as seen in the plan view,
wherein the peripheral part is continuous in a quadrangular annular manner and disposed outside the light emitting region corresponding part,
wherein the first non-pad region and the second non-pad region are provided at corners of the back surface when the back surface is seen in the plan view,
wherein the first L-shaped circuit board and the second L-shaped circuit board each have the curved continuous part in contact with the non-pad regions,
wherein the first FPC connecting-pad disposed part and the second FPC connecting-pad disposed part of the first L-shaped circuit board are provided on the first non-pad region and the second non-pad region to be in contact with the first non-pad region and the second non-pad region, respectively, the first FPC connecting-pad disposed part and the second FPC connecting-pad disposed part of the second L-shaped circuit board are provided on the first non-pad region and the second non-pad region, respectively, in contact with the first non-pad region and the second non-pad region, and
wherein the L-shaped circuit board further comprises:
a contact surface positioned on the planar light emitting tile side; and
a front-side surface opposite to the contact surface,
wherein the anode-dedicated equipotential region of at least the first L-shaped circuit board comprises:
a contact surface anode region positioned on the contact surface, and
a front-side surface anode region positioned on the front-side surface,
the contact surface anode region and the front-side surface anode region being electrically connected to each other to be equipotential,
wherein the cathode-dedicated equipotential region of at least the first L-shaped circuit board comprises:
a contact surface cathode region positioned on the contact surface; and
a front-side surface cathode region positioned on the front-side surface,
the contact surface cathode region and the front-side surface cathode region being electrically connected to each other to be equipotential, and
wherein part of the contact surface anode region and part of the front-side surface cathode region are at a position overlapping with each other with a space in a member thickness direction of the first L-shaped circuit board, and/or
part of the contact surface cathode region and part of the front-side surface anode region are at a position overlapping with each other with a space in the member thickness direction of the first L-shaped circuit board.

2. The planar light emitting device according to claim 1, wherein each of the L-shaped circuit boards having a portion that configures part of the overlapped region has the portion that configures the part of the overlapped region and another portion, and
wherein in the another portion, the anode-dedicated equipotential region is electrically connected to at least one of the anode pads and/or the cathode-dedicated equipotential region is electrically connected to at least one of the cathode pads.

3. The planar light emitting device according to claim 1, wherein the peripheral part consists of: the region where the anode pad is disposed; the region where the cathode pad is disposed; and the first non-pad region and the second non-pad region where none of the anode pad and the cathode pad are disposed.

4. The planar light emitting device according to claim 1, wherein the first L-shaped circuit board and the second L-shaped circuit board have a shape that linearly extends as seen in the plan view or a shape that is partially bent and extends.

5. The planar light emitting device according to claim 1, wherein at least the first L-shaped circuit board comprises at least one of the anode-side conductive part and the cathode-side conductive part in at least one of the first FPC connecting-pad disposed part and the second FPC connecting-pad disposed part on only one of the contact surface and the front-side surface, whereas at least the second L-shaped circuit board comprises at least one of the anode-side conductive part and the cathode-side conductive part in at least one of the first FPC connecting-pad disposed part and the second FPC connecting-pad disposed part on only the other of the contact surface and the front-side surface.

6. A planar light emitting device comprising:
a planar light emitting tile comprising:
    a light emitting surface having a light emitting region;
    a back surface, both of the light emitting surface and the back surface constituting main surfaces; and
    a planar light emitting element on the light emitting surface; and
a plurality of circuit boards on the back surface,
wherein the planar light emitting element comprises: an anode; and a cathode,
the planar light emitting element emitting light upon application of voltage between the anode and the cathode,
wherein the planar light emitting tile further comprises:
an anode pad conducted to the anode of the planar light emitting element to be equipotential;
a cathode pad conducted to the cathode of the planar light emitting element to be equipotential;
a region where the anode pad is disposed;
a region where the cathode pad is disposed; and
a first non-pad region and a second non-pad region where none of the anode pad and the cathode pad are disposed,
wherein each of the plurality of circuit boards is a flexible printed circuit and comprises:
an anode-dedicated equipotential region; and
a cathode-dedicated equipotential region,
wherein the plurality of circuit boards comprise:
a first L-shaped circuit board;
a second L-shaped circuit board adjacent to the first L-shaped circuit board; and
an overlapped region,
wherein part of the first L-shaped circuit board and part of the second L-shaped circuit board overlap with each other on the back surface, to be the overlapped region where the part of the second L-shaped circuit board is positioned between the part of the first L-shaped circuit board and the back surface,
wherein the overlapped region comprises at least one of an anode-side electrical connection site where the anode-dedicated equipotential region of the first L-shaped circuit board and the anode-dedicated equipotential region of the second L-shaped circuit board are electrically connected to each other, and a cathode-side electrical connection site where the cathode-dedicated equipotential region of the first L-shaped circuit board and the cathode-dedicated equipotential region of the second L-shaped circuit board are electrically connected to each other,
wherein the first non-pad region and the second non-pad region are a first connecting-part disposed region and a second connecting-part disposed region that overlap with the anode-side electrical connection site and the cathode-side electrical connection site, respectively, or overlap with the cathode-side electrical connection site and the anode-side electrical connection site, respectively,
wherein each of the L-shaped circuit boards comprises:
a body one-side part that linearly extends in a predetermined direction;
a body other-side part that linearly extends in a direction crossing the predetermined direction; and
a curved continuous part positioned between the body one-side part and the body other-side part,
the body one-side part and the body other-side part being continuous to each other,
the L-shaped circuit board having a shape of being partially bent and extending as seen in a plan view,
wherein a first flexible printed circuit (FPC) connecting-pad disposed part is provided at an end part of the body one-side part and a second FPC connecting-pad disposed part is provided at an end part of a body other-end part in an extending direction,
wherein the first FPC connecting-pad disposed part and the second FPC connecting-pad disposed part constitute part of the overlapped region, the first FPC connecting-pad disposed part comprising just one of an anode-side conductive part that forms part of the anode-side electrical connection site and a cathode-side conductive part that forms part of the cathode-side electrical connection site, and the second FPC connecting-pad disposed part comprising just the other of the anode-side conductive part and the cathode-side conductive part,
wherein the back surface of the planar light emitting tile consists of:
a light emitting region corresponding part that overlaps with the light emitting region as seen in the plan view; and a peripheral part, the back surface being quadrangular as seen in the plan view,
wherein the peripheral part is continuous in a quadrangular annular manner and disposed outside the light emitting region corresponding part,
wherein the first non-pad region and the second non-pad region are provided at corners of the back surface when the back surface is seen in the plan view,
wherein the first L-shaped circuit board and the second L-shaped circuit board each have the curved continuous part in contact with the non-pad regions,
wherein the first FPC connecting-pad disposed part and the second FPC connecting-pad disposed part of the first L-shaped circuit board are provided on the first non-pad region and the second non-pad region to be in contact with the first non-pad region and the second non-pad region, respectively, the first FPC connecting-pad disposed part and the second FPC connecting-pad disposed part of the second L-shaped circuit board are provided on the first non-pad region and the second non-pad region, respectively, in contact with the first non-pad region and the second non-pad region, and
wherein at least one of the plurality of L-shaped circuit boards comprises a power supplying terminal connectable to an external power supplying member for supplying power to the planar light emitting element, and wherein the power supplying terminal projects from the peripheral part toward the light emitting region corresponding part to overlap with the light emitting region corresponding part.

7. The planar light emitting device according to claim 6, wherein the plurality of L-shaped circuit boards are formed as a continuously annular integrated circuit board, the annular integrated circuit board being mounted on the back surface of the planar light emitting tile.

8. The planar light emitting device according to claim 7, wherein the annular integrated circuit board is continuous in a quadrangular annular manner so as to be square-annular shaped as seen in the plan view, and
wherein the annular integrated circuit board is positioned outside a portion overlapping with the planar light emitting element as seen in the plan view.

* * * * *